United States Patent
Belkacem-Boussaid et al.

(10) Patent No.: US 10,879,708 B2
(45) Date of Patent: Dec. 29, 2020

(54) BATTERY MANAGEMENT SYSTEM

(71) Applicant: Eos Energy Storage, LLC, Edison, NJ (US)

(72) Inventors: Kamel Belkacem-Boussaid, Edison, NJ (US); George W. Adamson, Edison, NJ (US)

(73) Assignee: Eos Energy Storage, LLC, Edison, NJ (US)

( * ) Notice: Subject to any disclaimer, the term of this patent is extended or adjusted under 35 U.S.C. 154(b) by 658 days.

(21) Appl. No.: 15/653,640

(22) Filed: Jul. 19, 2017

(65) Prior Publication Data

US 2018/0026454 A1 Jan. 25, 2018

Related U.S. Application Data

(60) Provisional application No. 62/365,455, filed on Jul. 22, 2016.

(51) Int. Cl.
*H02J 7/00* (2006.01)
*G01R 31/371* (2019.01)
(Continued)

(52) U.S. Cl.
CPC .......... *H02J 7/0021* (2013.01); *G01R 31/367* (2019.01); *G01R 31/3648* (2013.01); *G01R 31/371* (2019.01); *G01R 31/389* (2019.01); *G01R 31/3842* (2019.01); *G06N 3/08* (2013.01); *H02J 3/32* (2013.01); *H02J 7/0018* (2013.01); *H02J 7/0019* (2013.01); *H02J 7/34* (2013.01); *H02J 7/0022* (2013.01); *H02J 7/00034* (2020.01); *H02J 7/0048* (2020.01); *H02J 7/0068* (2013.01)

(58) Field of Classification Search
None
See application file for complete search history.

(56) References Cited

U.S. PATENT DOCUMENTS

| 2014/0062415 | A1* | 3/2014 | Barsukov | H02J 7/007192 |
| | | | | 320/134 |
| 2015/0127425 | A1* | 5/2015 | Greene | G06Q 30/0202 |
| | | | | 705/7.31 |
| 2015/0377974 | A1* | 12/2015 | Choi | G01R 31/367 |
| | | | | 702/63 |

\* cited by examiner

*Primary Examiner* — Gregory J Toatley, Jr.
*Assistant Examiner* — Terence E Stifter, Jr.
(74) *Attorney, Agent, or Firm* — Botos Churchill IP Law LLP

(57) ABSTRACT

A method includes receiving current measurements from at least one current sensor configured to measure current of a battery system in communication with a power distribution network having a power plant. The method also includes receiving voltage measurements from at least one voltage sensor configured to measure voltage of the battery system and temperature measurements from at least one temperature sensor configured to measure temperature of the battery system. The method includes determining an impedance parameter of the battery system based on the received measurements, a temperature parameter of the battery system based on the received measurements, a predicted voltage parameter based on the impedance parameter, and a predicted temperature parameter based on the temperature parameter. The method includes commanding the battery system to charge power from the power plant or discharge power from the power plant based on the predicted voltage parameter and the predicted temperature parameter.

18 Claims, 25 Drawing Sheets

(51) Int. Cl.
*G01R 31/389* (2019.01)
*G01R 31/3842* (2019.01)
*G01R 31/36* (2020.01)
*G06N 3/08* (2006.01)
*H02J 3/32* (2006.01)
*G01R 31/367* (2019.01)
*H02J 7/34* (2006.01)

BATTERY MANAGEMENT SYSTEM

CROSS REFERENCE TO RELATED APPLICATIONS

This U.S. patent application claims priority under 35 U.S.C. § 119(e) to U.S. Provisional Application 62/365,455, filed on Jul. 22, 2016. The disclosure of this prior application is considered part of the disclosure of this application and is hereby incorporated by reference in its entirety.

TECHNICAL FIELD

This disclosure relates to predicting a battery management system performance based on a time series analysis and a neural network of historical data of a battery system associated with the battery management system.

BACKGROUND

A battery management system (BMS) is an electronic system that manages a rechargeable battery system that includes one or more cells or battery packs. The BMS may protect the battery from operating outside a safe operating region and monitor a state of the battery (e.g., voltage, temperature, current, etc.). In addition, the BMS may calculate data associated with the battery and report the calculated data to external devices for monitoring, controlling the environment of the battery system, and authenticating and/or balancing the battery system. A battery built together with a BMS having an external communication bus becomes a smart battery.

The rechargeable battery system may be configured to store electrical energy on a large scale within an electrical power grid. For example, electrical energy is stored during times when production (for example, from intermittent power plants, such as renewable electricity sources, such as wind power, tidal power, solar power) exceeds consumption, and is returned to the grid when production falls below consumption. As such, the rechargeable battery system stores electrical energy when grid consumption is low and uses the stored electrical energy at times when consumption exceeds production from the power plant.

SUMMARY

One aspect of the disclosure provides a method implemented on data processing hardware that includes receiving current measurements from at least one current sensor configured to measure current of a battery system in communication with a power distribution network having a power plant distributing power to one or more consumers. The method also includes receiving voltage measurements from at least one voltage sensor configured to measure voltage of the battery system and temperature measurements from at least one temperature sensor configured to measure temperature of the battery system. The method includes determining an impedance parameter of the battery system based on the received measurements, a temperature parameter of the battery system based on the received measurements, a predicted voltage parameter based on the impedance parameter, and a predicted temperature parameter based on the temperature parameter. The method includes commanding the battery system to charge power from the power plant or discharge power from the power plant based on the predicted voltage parameter and the predicted temperature parameter.

Implementations of the disclosure may include one or more of the following optional features. In some implementations, determining the impedance parameter or the temperature parameter comprises determining a transfer function $H(w)$ of a time series $f(t)$ defined in a time interval $[-T, T]$, where T is an integer greater than zero. The transfer function $H(w)$, in a complex domain, may be defined as:

$$H(w) = \int_{-T}^{+T} f(t) e^{-i\omega t} dt,$$

where $w = 2\pi F$, F is a frequency of a time series of the received measurements, defined as $t \in R^n$ and $F \in C$. The transfer function $H(w)$ may be defined as a ratio between a Fourier transform of an output variable $y(t)$ and an input variable $x(t)$, where the output variable $y(t)$ is one of the impedance parameter or the temperature parameter, and the input variable $x(t)$ is one or more of the received measurements. The transfer function $H(w)$ in a discrete domain may be determined as:

$$H(w) = \frac{\sum_{p=1}^{N} y(p) e^{-i\omega p}}{\sum_{p=1}^{N} x(p) e^{-i\omega p}}.$$

In some implementations, determining one of the predicted voltage parameter or the predicted temperature parameter includes executing a time series analysis implementing an auto-regressive model. The auto-regressive model $AR(p)$ may be defined as:

$$X_t = c + \sum_{i=1}^{P} \varphi_i X_{t-i} + \epsilon_t,$$

where $\varphi_1$-$\varphi_p$ are parameters of the model, c is a constant, and $\epsilon_t$ is white noise. The method may also include implementing a neural network approach, an empirical recursive method, or a Yule-Walker approach to determine an optimal solution of the auto-regressive model $AR(p)$.

In some implementations, commanding, by the data processing hardware, the battery system to charge power from the power plant includes commanding the battery system to store power from the power plant.

In some implementations, the method includes updating an impedance profile, a voltage profile, or a temperature profile based on the voltage measurements or the temperature measurements.

In some implementations, determining the predicted voltage parameter includes training the data processing hardware to generate a best fit of the voltage measurements or the temperature measurements. In some implementations, predicting, by the data processing hardware, the predicted voltage parameter or the predicted temperature parameter based on the best fit of the voltage measurements or the temperature measurements, respectively.

In some implementations, the method includes tracking, by the data processing hardware, a remaining available capacity of the battery system. The method may also include determining, by the data processing hardware, one of a charge state or life cycle of the battery system.

Another aspect of the disclosure provides a system including data processing hardware and memory hardware. The memory hardware may be in communication with the data processing hardware and may store instructions that when executed on the data processing hardware cause the data processing hardware to perform operations. The operations include receiving current measurements from at least one current sensor configured to measure current of a battery system in communication with a power distribution network having a power plant distributing power to one or more consumers. The operations also include receiving voltage measurements from at least one voltage sensor configured to measure voltage of the battery system. The operations further include receiving temperature measurements from at least one temperature sensor configured to measure temperature of the battery system. The operations also include determining an impedance parameter of the battery system based on the received measurements, and determining a temperature parameter of the battery system based on the received measurements. The operations further include determining a predicted voltage parameter based on the impedance parameter, and determining a predicted temperature parameter based on the temperature parameter. The operations also include commanding the battery system to charge power from the power plant or discharge power from the power plant based on the predicted voltage parameter and the predicted temperature parameter.

Implementations of this aspect of the disclosure may include one or more of the following optional features. In some implementations, determining the impedance parameter or the temperature parameter comprises determining a transfer function H(w) of a time series $f(t)$ defined in a time interval [−T,T], where T is an integer greater than zero. The transfer function H(w), in a complex domain, may be defined as:

$$H(w) = \int_{-T}^{+T} f(t) e^{-i\omega t} dt,$$

where w=2πF, F is a frequency of a time series of the received measurements, defined as t∈$R^n$ and F∈$C^n$. The transfer function H(w) may be defined as a ratio between a Fourier transform of an output variable y(t) and an input variable x(t), where the output variable y(t) is one of the impedance parameter or the temperature parameter, and the input variable x(t) is one or more of the received measurements. The transfer function H(w) in a discrete domain may be determined as:

$$H(w) = \frac{\sum_{p=1}^{N} y(p) e^{-i\omega p}}{\sum_{p=1}^{N} x(p) e^{-i\omega p}}.$$

In some implementations, determining one of the predicted voltage parameter or the predicted temperature parameter includes executing a time series analysis implementing an auto-regressive model. The auto-regressive model AR(p) may be defined as:

$$X_t = c + \sum_{i=1}^{P} \varphi_i X_{t-i} + \epsilon_i,$$

where $\varphi_i$-$\varphi_p$ are parameters of the model, c is a constant, and $\epsilon_t$ is white noise. The method may also include implementing a neural network approach, an empirical recursive method, or a Yule-Walker approach to determine an optimal solution of the auto-regressive model AR(p).

In some implementations, commanding the battery system to charge power from the power plant includes commanding the battery system to store power from the power plant.

In some implementations, the operations include updating an impedance profile, a voltage profile, or a temperature profile based on the voltage measurements or the temperature measurements.

In some implementations, determining the predicted voltage parameter includes training the data processing hardware to generate a best fit of the voltage measurements or the temperature measurements. In some implementations, the operations include predicting the predicted voltage parameter or the predicted temperature parameter based on the best fit of the voltage measurements or the temperature measurements, respectively.

In some implementations, the operations include tracking a remaining available capacity of the battery system and determining one of a charge state or life cycle of the battery system.

In some implementations, determining the impedance parameter or the temperature parameter includes determining a transfer function H(w) of a time series $f(t)$ defined in a time interval [−T, T], where T is an integer greater than zero. The transfer function H(w), in a complex domain, may be defined as:

$$H(w) = \int_{-T}^{+T} f(t) e^{-i\omega t} dt,$$

where w=2πF, F is a frequency of a time series of the received measurements, defined as t∈$R^n$ and F∈$C^n$. The transfer function H(w) may be defined as a ratio between a Fourier transform of an output variable y(t) and an input variable x(t), where the output variable y(t) is one of the impedance parameter or the temperature parameter, and the input variable x(t) is one or more of the received measurements. The transfer function H(w) in a discrete domain may be determined as:

$$H(w) = \frac{\sum_{p=1}^{N} y(p) e^{-i\omega p}}{\sum_{p=1}^{N} x(p) e^{-i\omega p}}.$$

In some implementations, determining one of the predicted voltage parameter or the predicted temperature parameter includes executing a time series analysis implementing an auto-regressive model.

In some implementations, commanding the battery system to charge power from the power plant includes commanding the battery system to store power from the power plant.

In some implementations, the operations include updating an impedance profile, a voltage profile, or a temperature profile based on the voltage measurements or the temperature measurements.

In some implementations, determining the predicted voltage parameter includes training the data processing hardware to generate a best fit of the voltage measurements or the temperature measurements. Determining the predicted voltage parameter may also include predicting, by the data processing hardware, the predicted voltage parameter or the predicted temperature parameter based on the best fit of the voltage measurements or the temperature measurements, respectively.

In some implementations, the instructions, when executed on the data processing hardware, cause the data processing hardware to track a remaining available capacity of the battery system and determine one of a charge state or life cycle of the battery system.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
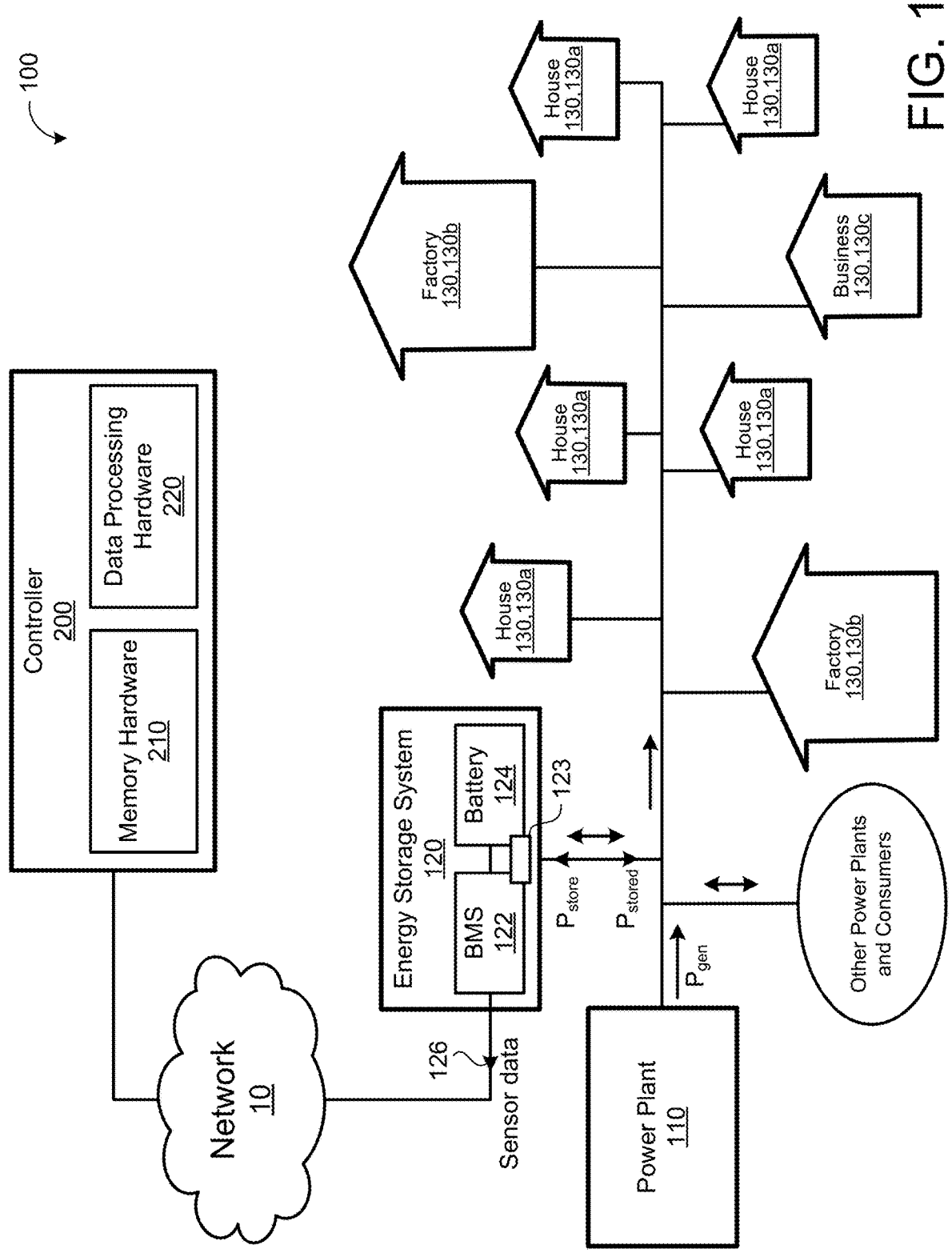
FIG. 1 is a functional block diagram of an exemplary power distribution network.

FIG. 1 illustrates an exemplary power distribution network 100 configured to transmit power from a power plant 110 to an energy storage system 120 and to individual consumers 130. The energy storage system 120 includes a battery management system (BMS) 122 in communication with a rechargeable battery system 124. The battery system 124 includes power storage devices (e.g., batteries) configured to capture power from the power plant 110 and store the power for distribution at a later time. The rechargeable battery system 124 stores electrical energy on a large scale within the power distribution network 100. In some examples, for large battery systems 124 that include multiple batteries, the behavior of the ensemble of batteries is the same as the average behavior of the individual batteries.

The cost to supply electricity varies during the course of a single day. As such, the wholesale price of electricity on the power distribution network 100 reflects the real-time cost for supplying electricity from the power plant 110. For example, electricity demand is usually highest in the afternoon and early evening (peak hours), and costs to provide electricity are usually higher at these times. Usually, most consumers 130 pay prices based on the seasonal average cost of providing electricity. Therefore, the consumers 130 do not notice the daily fluctuation in electricity prices. As such, it is desirable to have a power distribution network 100 that is configured to store electricity during off-peak hours and distribute the stored electricity during the peak hours to reduce the demand on the power plant 110. In some examples, the energy storage system 120 stores renewable energy, such as energy produced by wind and solar, which are intermittent, and therefore the rechargeable battery system 124 stores the intermittent renewable energy to provide smooth electricity to the consumers 130. The consumers 130 may include one or more of a house consumer 130a, a factory consumer 130b, a business consumer 130c, or any other consumer that receives electrical power from the power distribution network 100.

The BMS 122 manages the rechargeable battery system 124 and protects the battery from operating outside a safe operating state. In addition, the BMS 122 monitors the performance of the battery system 124, for example, by monitoring a voltage, a temperature, and a current of the battery system 124. Consequently, the BMS 122 may report the monitored data to a controller 200. In some examples, the BMS 122 performs calculations on the monitored data before sending the data to the controller 200; while in other examples, the BMS 122 sends the controller 200 the raw data.

The energy storage system 120 may be in communication with the controller 200 via a network 10. The network 10 may include various types of networks, such as a local area network (LAN), wide area network (WAN), and/or the Internet. The controller 200 receives data from the BMS 122, e.g., from sensors 123 associated with the battery system 124 of the energy storage system 120, and monitors the sensors 123 to predict the performance of the battery system 124. As such, the controller 200 executes a series analysis of the received data 126 from the sensors 123.

Figure 2A:
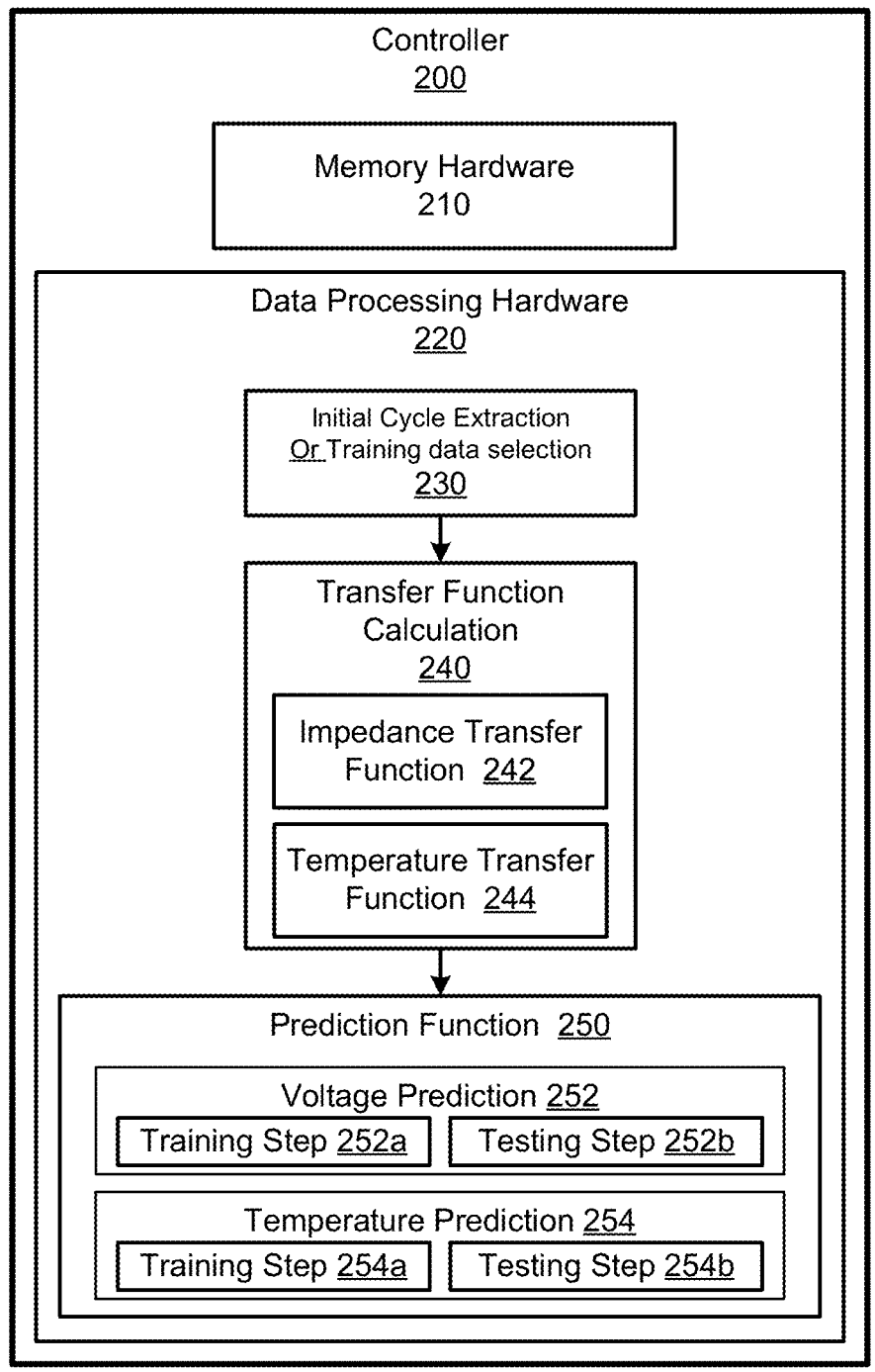
FIG. 2A is a functional block diagram of an exemplary controller of the power distribution network of FIG. 1.
Figure 2B:
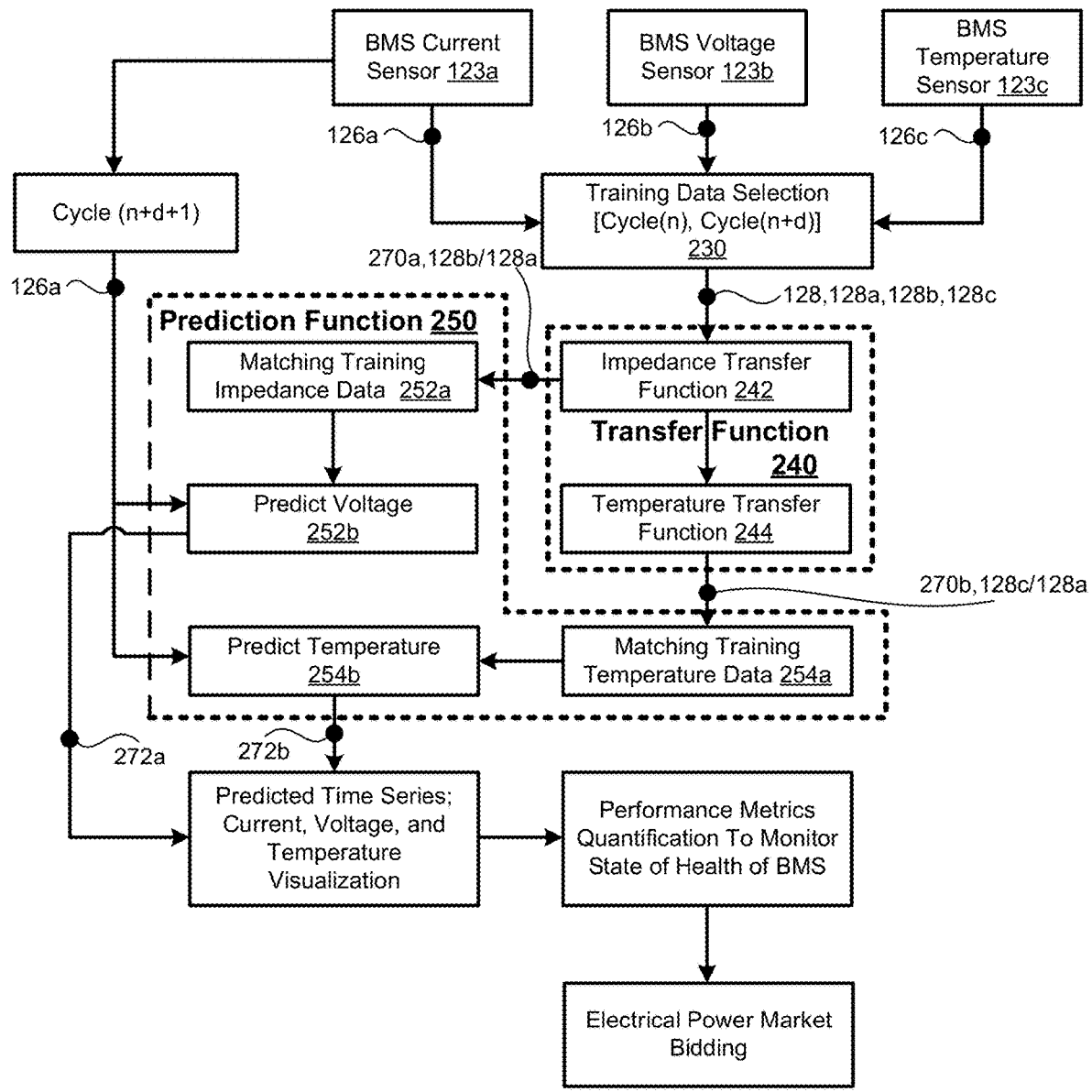
FIG. 2B is a schematic view of an exemplary arrangement of operations for a method of predicting a performance of an energy storage system.

Referring additionally to FIGS. 2A and 2B, the initial cycles of received data 126 from the sensors 123 are considered as learning cycles or learning parameters, which are used to predict an impedance/resistance profile (at impedance transfer function 242) that is applied to predict the voltage (at voltage prediction 252b) and temperature (at temperature prediction 254b). Since the controller 200 continuously receives the data 126 from the sensors 123, for example, via the network 10, the controller 200 continuously updates the profile of the resistance and therefore the profiles of the voltage and temperatures. As such, the controller 200 may execute algorithms to predict the performance of the battery system 124 and use the predicted metrics to bid on the electrical power of the BMS into the market.

As will be described in more detail below, the learning cycles or learning parameters utilized by the algorithms described herein allow the controller 200 to predict future performance of the battery system 124 to avoid failures thereof and to accurately and efficient instruct the BMS 122 to transmit energy to or from the battery system 124 for storage or use. For example, by utilizing previously generated data 126, the algorithms allow the BMS 122 to predict the future performance of the battery system 124 and make decisions (e.g., instruct the battery system 124 to store electrical power or discharge electrical power) to increase the efficiency and longevity of the energy storage system 120. Utilization of the learning cycles by the algorithms allows the BMS 122 to learn from previously generated data 126 transmitted from the sensors 123 in order to build accurate models that predict future performance of the battery system 124. The predictions and decisions made by the BMS 122 increase the efficiency and longevity of the battery system 124 relative to battery management systems relying on rigid, static rules. For example, modeling and optimization based on the previously generated data 126 increases the accuracy of quantified measurements of the data 126, while adjusting decisions and outcomes in response to changes in the data 126 ensures accurate measurements and interpretation of the data 126. The utilization of robust programming protocols or procedures (e.g., C++ procedures) reduces the amount of time required for the controller 200 to execute the algorithms described herein.

The controller 200 includes memory hardware 210 that stores instructions and data processing hardware 220 that executes the instructions to perform one or more operations. The memory hardware 210 may be physical devices used to store programs (e.g., sequences of instructions) or data (e.g., program state information) on a temporary or permanent basis for use by a computing device. The non-transitory memory may be volatile and/or non-volatile addressable semiconductor memory. Examples of non-volatile memory include, but are not limited to, flash memory and read-only memory (ROM)/programmable read-only memory (PROM)/erasable programmable read-only memory (EPROM)/electronically erasable programmable read-only memory (EEPROM) (e.g., typically used for firmware, such as boot programs). Examples of volatile memory include, but are not limited to, random access memory (RAM), dynamic random access memory (DRAM), static random access memory (SRAM), phase change memory (PCM) as well as disks or tapes.

The data processing hardware 220 may be in communication with the memory hardware 210 and may execute the instructions to perform one or more operations. In some implementations, the data processing hardware 220 executes an initial cycle extraction function 230, a transfer function calculation function 240, and a prediction function 250. The executed functions 230, 240, 250 use the captured sensor data 126 to predict the future performance of the energy storage system 120, specifically the BMS 122.

In some implementations, the BMS 122 includes a current sensor 123a, a voltage sensor 123b, and a temperature sensor 123c associated with the battery system 124. The data processing hardware 220 receives sensor signals 126a, 126b, 126c from each one of the current sensor 123a, the voltage sensor 123b, and the temperature sensor 123c, respectively.

Training Data Selection

The initial cycle extraction function 230, the transfer function calculation function 240, and the prediction function 250 executed on the data processing hardware 220 may evolve and update as more signal data 126 is received from the BMS 122. As such, the core of the functions 230, 240, 250 are based on an evolving training process that includes the use of historical signal data 126 recorded by the BMS 122 from the sensors 123 in the time interval [t, t+n] to predict the data at cycle t+n+1, where t is a current time and n is positive number greater than zero.

Once the data processing hardware 220 receives the sensor data signals 126, the data processing hardware 220 executes a cost function that defines a mathematical relationship between the different data signal 126 associated with each one of the sensors 123a, 123b, 123c. Accordingly, the training data is continuously evolving since the selection of the historical signal data 126 is revisited every n cycles. This continuous update of the historical signal data 126 allows the controller 200 to capture changes in the signal data 126 during its cycling regimen. The optimization of a training factor may depend on the characteristics of the BMS under-consideration.

Transfer Function

Figure 2C:
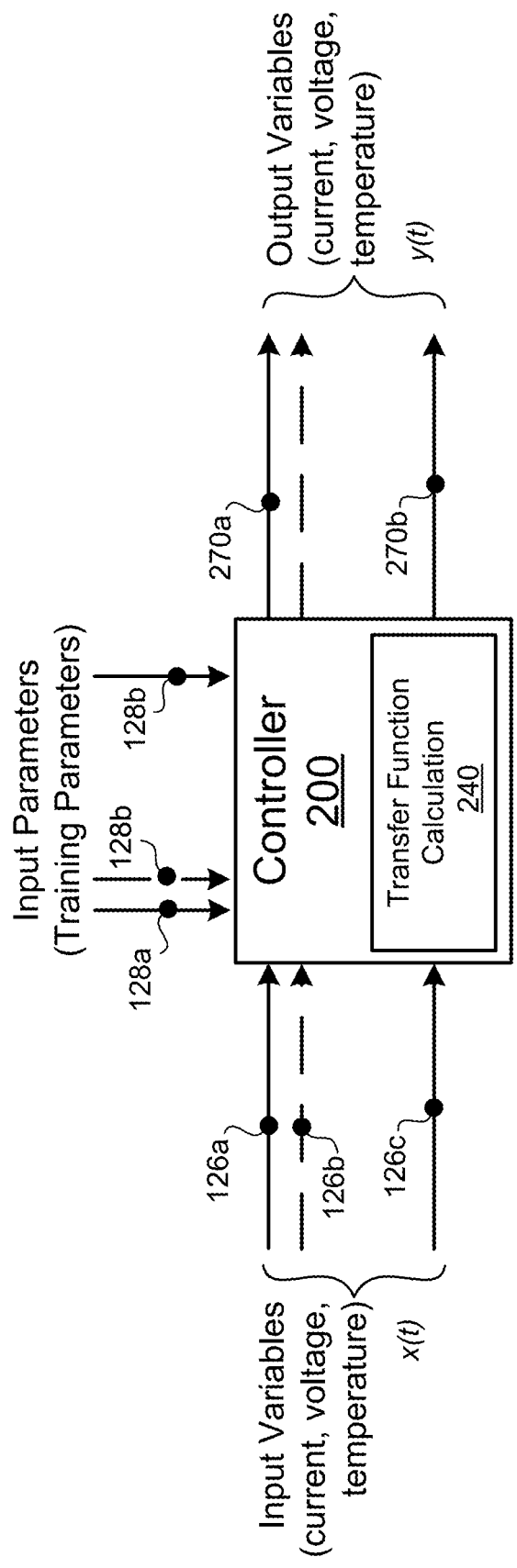
FIG. 2C is a functional block diagram of an exemplary controller of the power distribution network of FIG. 1.

As shown in FIG. 2C, the controller 200 receives input variables, i.e., sensor signals 126a, 126b, 126c, and outputs prediction output variables 270a, 270b using training parameters 128a, 128b, 128c outputted from the training data selection function 230. More specifically, the inputs-outputs relationship can be defined as transfer functions (i.e., the impedance transfer function 242 and a temperature transfer function 244) of the controller 200.

In a continuous domain, a Fourier transform H(w) of a time series $f(t)$ defined in the interval $[-T, T]$, where T is an integer greater than zero, is given by the following equation:

$$H(w) = \int_{-T}^{+T} f(t) e^{-i\omega t} dt \quad (1)$$

where $w = 2\pi F$, F is a frequency of the time series, $t \in \mathbb{R}^n$ and $F \in \mathbb{C}^n$. H(w) is defined in a complex domain.

The transfer function H(w), i.e., the impedance transfer function 242 and/or the temperature transfer function 244, executed by the controller 200 is a ratio between the Fourier transform of the output variable y(t) and the input variable x(t) and is defined in the discrete domain as:

$$H(w) = \frac{\sum_{p=1}^{N} y(p) e^{-i\omega p}}{\sum_{p=1}^{N} x(p) e^{-i\omega p}}. \quad (2)$$

For the voltage prediction, the transfer function is defines as $$H_v(w) = \frac{\sum_{p=1}^{N} V(p) e^{-i\omega p}}{\sum_{p=1}^{N} I(p) e^{-i\omega p}}. \quad (2A)$$

For the temperature prediction, the transfer function is defined as:

$$H_T(w) = \frac{\sum_{p=1}^{N} T(p)e^{-i\omega p}}{\sum_{i=1}^{N} I(p)e^{-i\omega p}}. \quad (2B)$$

In some examples, the controller 200 uses the outputs of the transfer function H(w) (e.g., transfer function calculation function 240) to train a neural network 300 (FIG. 3) and to test for predictions. The transfer function H(w) is defined in the Fourier domain as a complex vector, having two parts: a magnitude |H| and a phase φ. Both the magnitude |H| and the phase φ of the transfer function H(w), i.e., the impedance transfer function 242 and/or the temperature transfer function 244, are used in the training and testing/prediction functions to generate and improve the training sets used to predict the new data. To recover the predicted voltage and temperature, the inverse Fourier transform function may be applied to the product between the trained transfer function and the current Fourier transform. The magnitude of the current Fourier transform defines a voltage magnitude and a temperature magnitude that is obtained by converting the complex values into real values for further analysis and visualization.

The magnitude |H| of the transfer function H(w) is shown by:

$$|H| = \sqrt{H_{real}^2 + H_{imag2}^2}; \quad (3)$$

where $H_{real}$ and $H_{imag}$ are the real and imaginary parts of the transfer function H(w).

The phase φ of the transfer function H(w) is shown by:

$$\phi = \operatorname{atan}\left(\frac{H_{real}}{H_{imag}}\right) \quad (4)$$

The magnitude |H| and the phase φ of the transfer function H(w) may vary over time and frequency. The magnitude |H| is used to quantify the performance metrics and to track and monitor the voltage and temperature distribution over time for maintenance purposes. In some examples, the phase φ is used to show the angular differences between the measured and predicted data. The phase φ may also be used as a metric to track phase changes in the data that could be interpreted in some situations as deviations from a normal stage.

The transfer function H(w) is applied to two separate transfer functions, which are the voltage/current 270a (impedance function 242) and the temperature/current 270b (temperature function 244). The transfer function H(w) (e.g., transfer function calculation function 240) outputs training parameters 128, i.e., impedance training parameters 128b/128a and temperature training parameters 128c/128a.

Prediction

The prediction function 250 uses current sensor data 126a to predict the voltage and the temperature (predicted voltage 272a, predicted temperature 272b), with the previous recorded values of the voltage and the temperature 270a, 270b used in the training data selection 230. The prediction function 250 includes a training step 252 and a testing step 254. In addition, the prediction function 250 is applied to each one of the voltage and temperature separately. The prediction function 250 includes the steps of matching training impedance data 252a, matching training temperature data 254a, predict voltage 252b, and predict temperature 254b.

Prediction: Training Step

During the training step 252a, 254a, the controller 200 is trained on the historical training data 126 to generate the best fit of the topology of the training data 126 and then uses those training entities to predict BMS data 272 into the future. Generally, any learning machine needs representative examples of the data 128 in order to capture the underlying structure that allows it to generalize to new or predicted cases. As such, the controller 200 may be considered as an adaptive filtering, since it depends only on the intrinsic structure of the data 128. In some implementations, the training step 252a, 254a includes cross-validating the predicted BMS data 272 relative to the historical training data 126 to minimize convergence errors.

As will be explained in more detail below, in some implementations, the training step 252a, 254a is optimized by combining, with the controller 200, for example, the inputs (e.g., current signal 126a, voltage signal 126b, or temperature signal 126c) from each of the sensors (e.g., the current sensor 123a, the voltage sensor 123b, or the temperature sensor 123c, respectively) in order to reduce the quantity of learning cycles. For example, the training step 252a, 254a may use only the first five learning cycles as inputs to converge into a minimal convergence error.

Table (1) shows a mean square error (MSE) between the measured data (e.g., current signal 126a, voltage signal 126b, or temperature signal 126c) and the predicted data (e.g., predicted BMS data 272), where the error is minimized during the training step.

TABLE 1

| MSE | Predicted Cycle 1 | Predicted Cycle 2 | Predicted Cycle3 | Predicted Cycle4 | Predicted Cycle5 |
| --- | --- | --- | --- | --- | --- |
| Measured | 0.1460 | 0.0822 | 0.0717 | 0.0668 | 0.0224 |

An accurate prediction of the remaining discharge time of the battery system 124 allows for tracking the health of the battery system 124 relative to a number of charge-discharge cycles of the battery system 124.

Prediction: Testing Step

During the testing step 252b, 254b, the controller 200 predicts new data 272 using the overall structure captured during the training step 252a, 254a, i.e., the best fit of the topology of the training data 126. The testing step 252b, 254b is similar to the training step 252a, 254a. However, in the testing step 252b, 254b, the current sensor data 126a is used as the input.

Prediction: Voltage Prediction

The voltage prediction function 252 includes the training step 252a and the testing step 252b. The controller 200 applies the voltage prediction function 252 to both the voltage data 126b and the temperature data 126c. The current signal 126a is considered as a known variable of the voltage prediction function 252. In some examples, the current signal 126a may be determined from a power of the battery system 124 using Ohm's law. Ohm's law states that a current through a conductor between two points is directly proportional to the voltage across the two points, i.e., I=V/R, where I is the current through the conductor in units of ampere, V is the voltage measured across the conductor in units of volts, and R is the resistance of the conductor in units of ohms. However, the controller 200 determines the resistance/impedance prior to the application of Ohm's law.

Prediction: Temperature Prediction

The temperature prediction function 254 includes the training step 254a and the testing step 254b. Heat (or temperature) is an important parameter that affects the health of the battery system 124 of the energy storage system 120. Therefore, it is important to track the temperature of the battery system 124 over time.

Prediction: Calculations

The controller 200 determines the prediction function 250 by using time series analysis. A time series is a sequence of data points drawn from successively equally spaced points in time, i.e., sensor data 126a, 126b, 126c from the sensors 123. Therefore, the time series is a sequence of discrete-time data. Time series analysis includes a method for analyzing the time series data to extract meaningful statistics and other characteristics of the time series data. To predict the parameters of interest, i.e., voltage and temperature, the controller 200 employs an auto-regressive (AR) model on the time series. An AR model is a representation of a type of random process, as such, it describes certain time-varying processes in nature, economics, etc. The AR model specifies that the output variable depends linearly on its own previous values and on stochastic term (an imperfectly predictable term). Thus, the model is in the form of a stochastic difference equation.

The notation AR(p) indicates an autoregressive model of order p. The AR(p) model is defined as:

$$X_t = c + \Sigma_{i=1}^{p} \varphi_i X_{t-i} + \epsilon_t; \qquad (5)$$

where $\varphi_1$-$\varphi_p$ are the parameters of the prediction function 250, c is a constant, and $\epsilon_t$ is white noise.

Once the training parameters 128 are outputted, the training parameters 128 are used to predict new data. In some examples, the controller 200 determines an optimal solution of the AR model time series predictions by executing one of a neural network approach, an empirical recursive method, or a Yule-Walker Approach.

Neural Network Approach

Artificial neural networks (ANNs) are a family of models inspired by biological neural networks, such as the central nervous system of animals, and, in particular, the brain. The ANNs are used to estimate or approximate functions that can depend on a large number of inputs and are generally unknown. In some examples, the ANNs are defined using three components: architecture rule; activity rule; and learning rule. The architecture rule of the ANNs specifies variables that are involved in the network and their topological relationships. The activity rule defines how the activities of neurons change in response to each other. The learning rule specifies the way in which the neural network's rights change with time (see FIG. 3).

Figure 3:
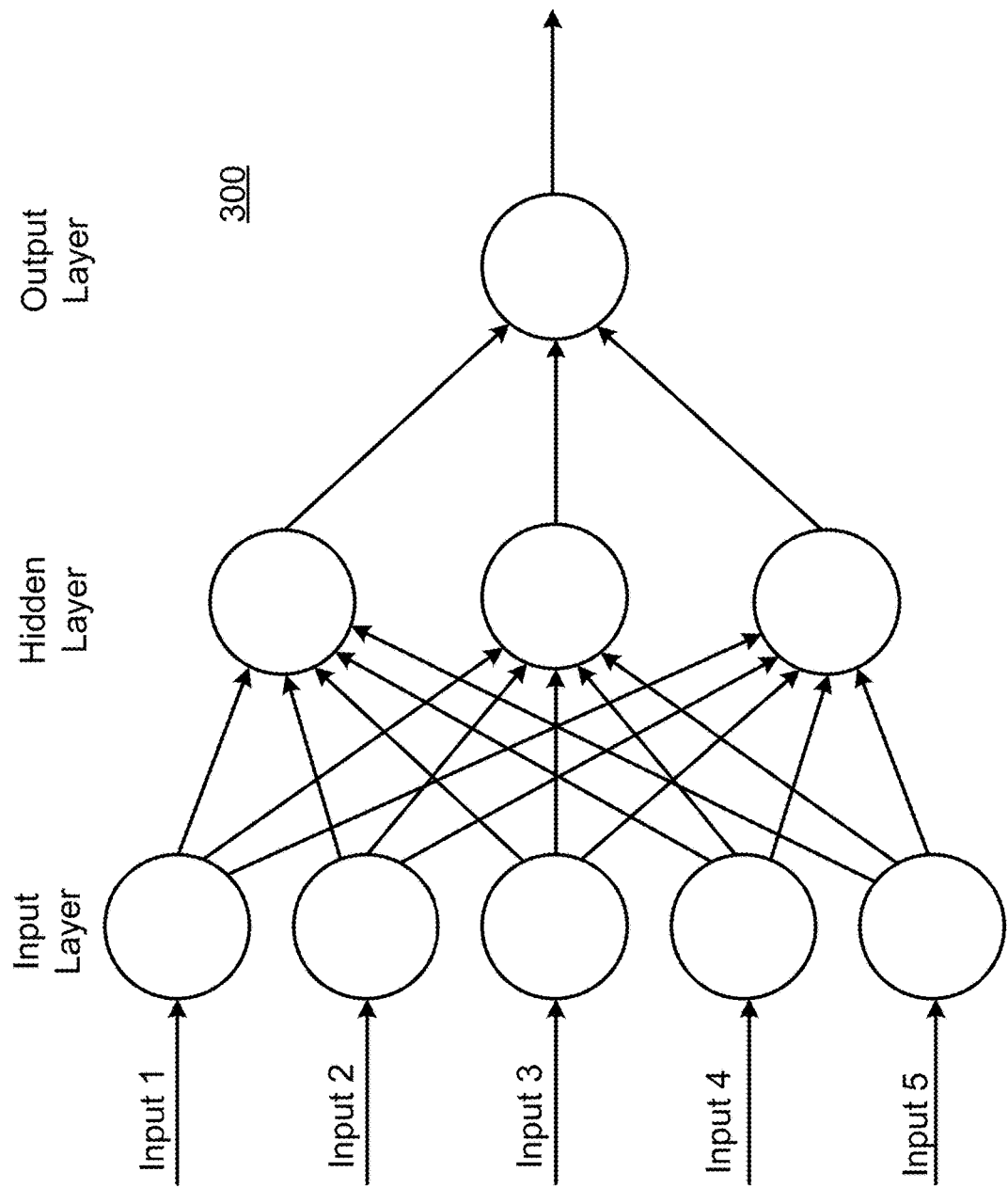
FIG. 3 is a functional block diagram of an exemplary artificial neural network.

Referring to FIG. 3, in some implementations, a neural network 300 can be viewed as a nonlinear system with a basic form:

$$F(x,w) = y; \qquad (6)$$

where x is the input vector presented to the network, w is the weight vector of the network, and y is the corresponding output vector approximated or predicted by the network. The weight vector w is commonly ordered first by layer, then by neurons, and finally by the weights of each neuron plus its bias.

In some examples, the controller 200 uses the Levenberg-Marquardt algorithm to solve the nonlinear system of the neural network 300. The Levenberg-Marquardt algorithm (LMA) is also known as the damped least-squares (DLS) method, and is used to solve non-linear least square problems. The Levenberg-Marquardt algorithm is:

$$(J^T J + \gamma 1)\delta = J^T E \qquad (7)$$

where J is the Jacobian matrix for the system, $\gamma$ is the Levenberg's damping factor, $\delta$ is the weight update vector that the controller 200 is determining, and E is the error vector containing the output errors for each input vector on training network.

$$J = \begin{bmatrix} \frac{\partial F(x_1, w)}{\partial w_1} & \cdots & \frac{\partial F(x_1, w)}{\partial w_W} \\ \vdots & \ddots & \vdots \\ \frac{\partial F(x_N, w)}{\partial w_1} & \cdots & \frac{\partial (x_N, w)}{\partial w_W} \end{bmatrix} \qquad (8)$$

where $F(x_i, w)$ the network function is evaluated for the $i^{th}$ input vector of the training set using the weight w and $w_j$ is the $j^{th}$ element of the weight vector w of the network.

For the neural network 300, the Jacobian matrix is approximated using the chain rule and the first derivatives of the activation functions. The chains rule is a formula for computing the derivative of the composition of two or more functions. For example, if f and g are functions, then the chain rule expresses the derivative of their composition.

Back propagation neural network (BPN) is a supervised learning algorithm in which the input data are supplied together with the desired output. The BPN has two hidden layers. The BPN learns during a training epoch. In this case, the BPN goes through 1000 epochs with momentum of 0.5 and learning rate 0.5 to converge to the optimal solution in which the error is minimized. A training epoch for each entry consists of the following steps: feed input data into the network; initialize weights; check output against desired value and feedback error; calculate the error; and update the weights between neurons which are calculated using the Levenberg-Marquardt method. Feature selection may be applied on the input layer of the BPN (e.g., neural network 300) using regularization Bayesian methodology to reduce redundancy and to ensure better accuracy of the output.

At each activation of the neuron of the hidden layers and the output layers, the weighted sums are calculated and passed through the activation function defined as:

$$w\text{Sum} = \Sigma_{i=1}^{n} \text{weight}_i * \text{input}_i.$$

The final adjusted weights that minimize the error are mapped into the new input data to predict the new variables such as voltage and temperature.

Figure 4:
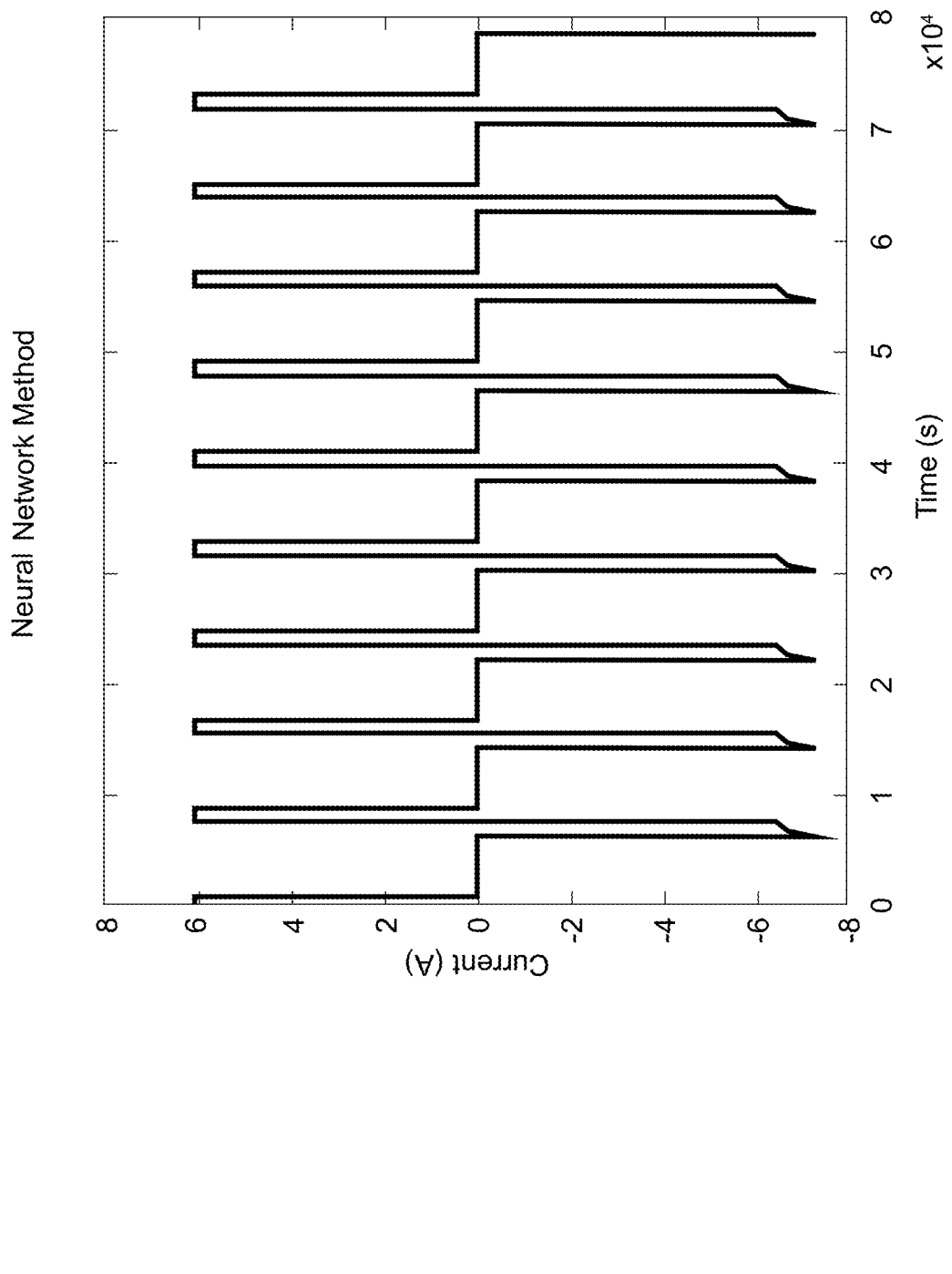
FIG. 4 is a graph of an exemplary input current obtained from battery system sensors.
Figure 5:
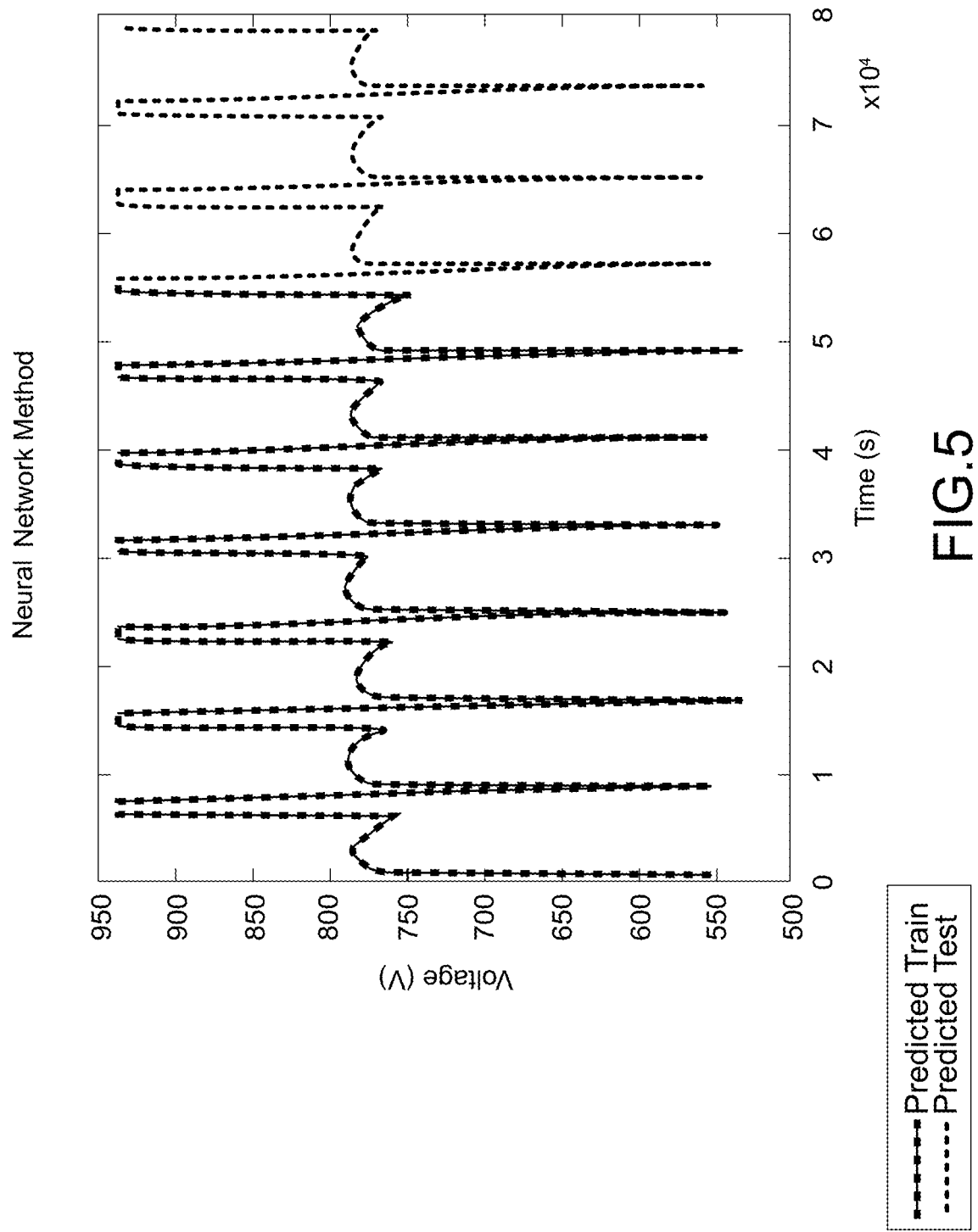
FIG. 5 is a graph of an exemplary voltage predicted from training and testing the neural network of FIG. 3.
Figure 6A:
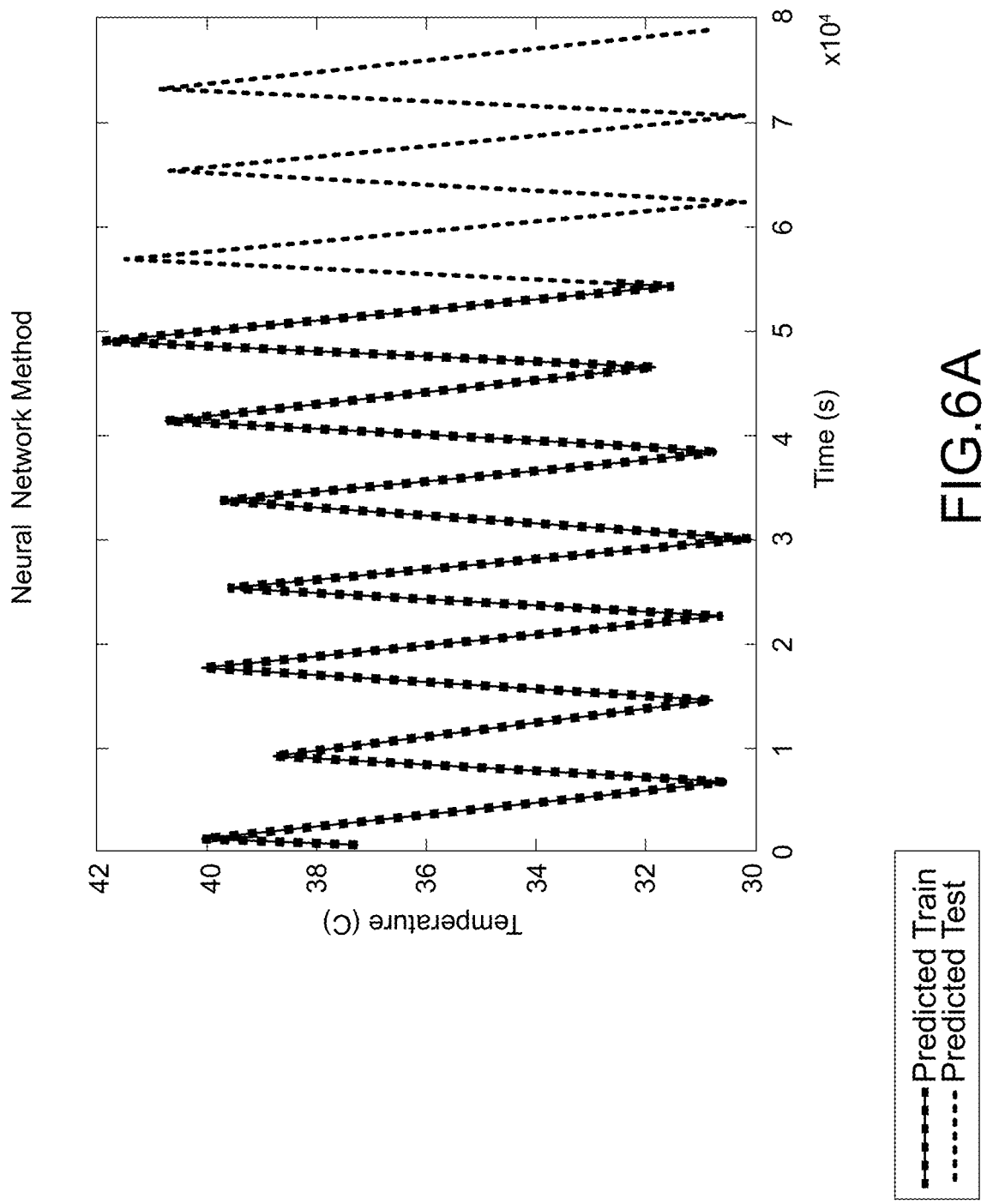
FIG. 6A is a graph of an exemplary temperature predicted from training and testing the neural network of FIG. 3.

FIG. 4 shows a graph of exemplary input current data 126a obtained from a battery system sensor 123a. FIG. 5 shows a graph of exemplary predicted voltage data 272a from training and testing the neural network using the input current data 126a obtained from the battery system sensors 123a shown in FIG. 4. In addition, FIG. 6A shows a graph of exemplary predicted temperature data 272b from training and testing the neural network using the input current data 126a obtained from the battery system sensors 123a shown in FIG. 4.

Figure 6B:
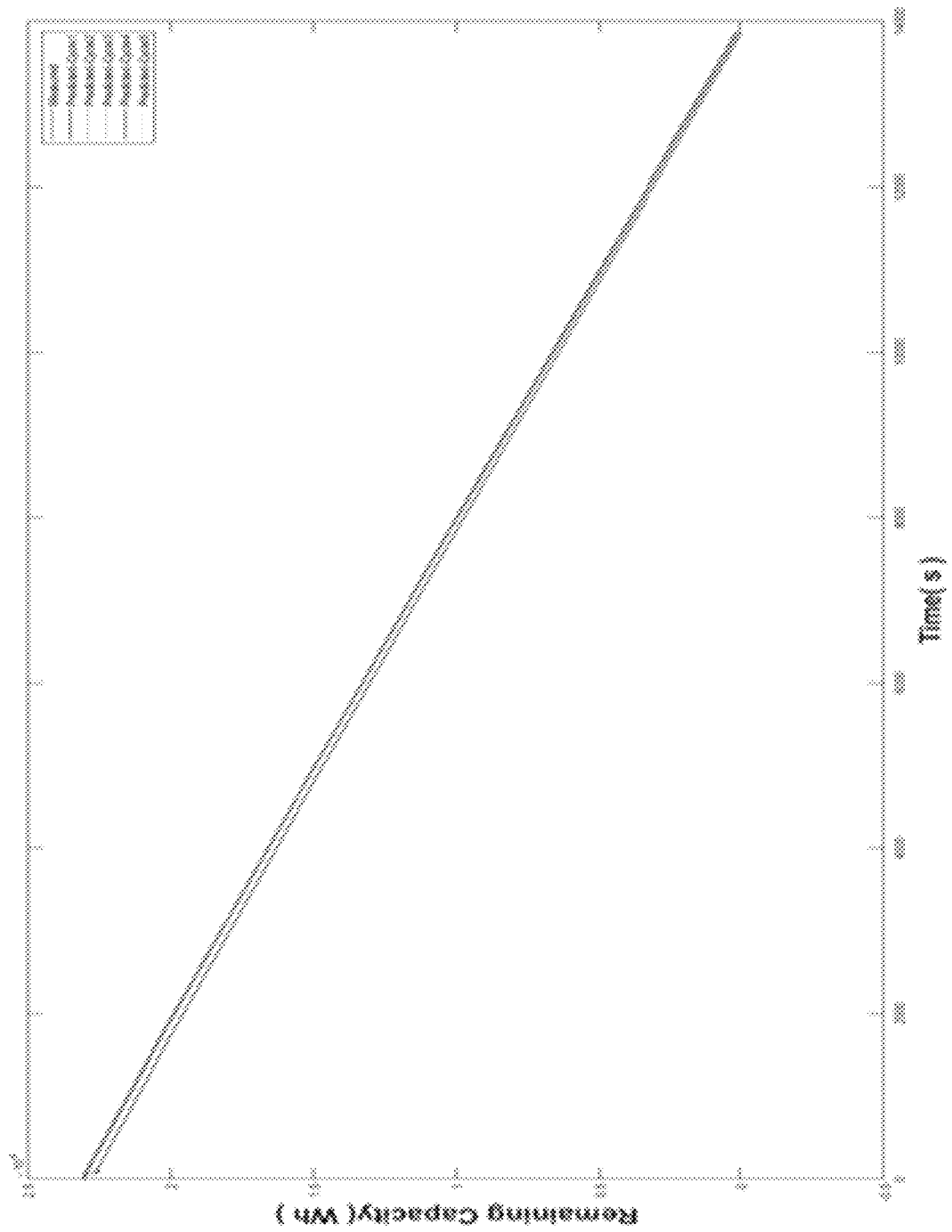
FIG. 6B is a graph of an exemplary remaining capacity predicted from training and testing the neural network of FIG. 3.
Figure 6C:
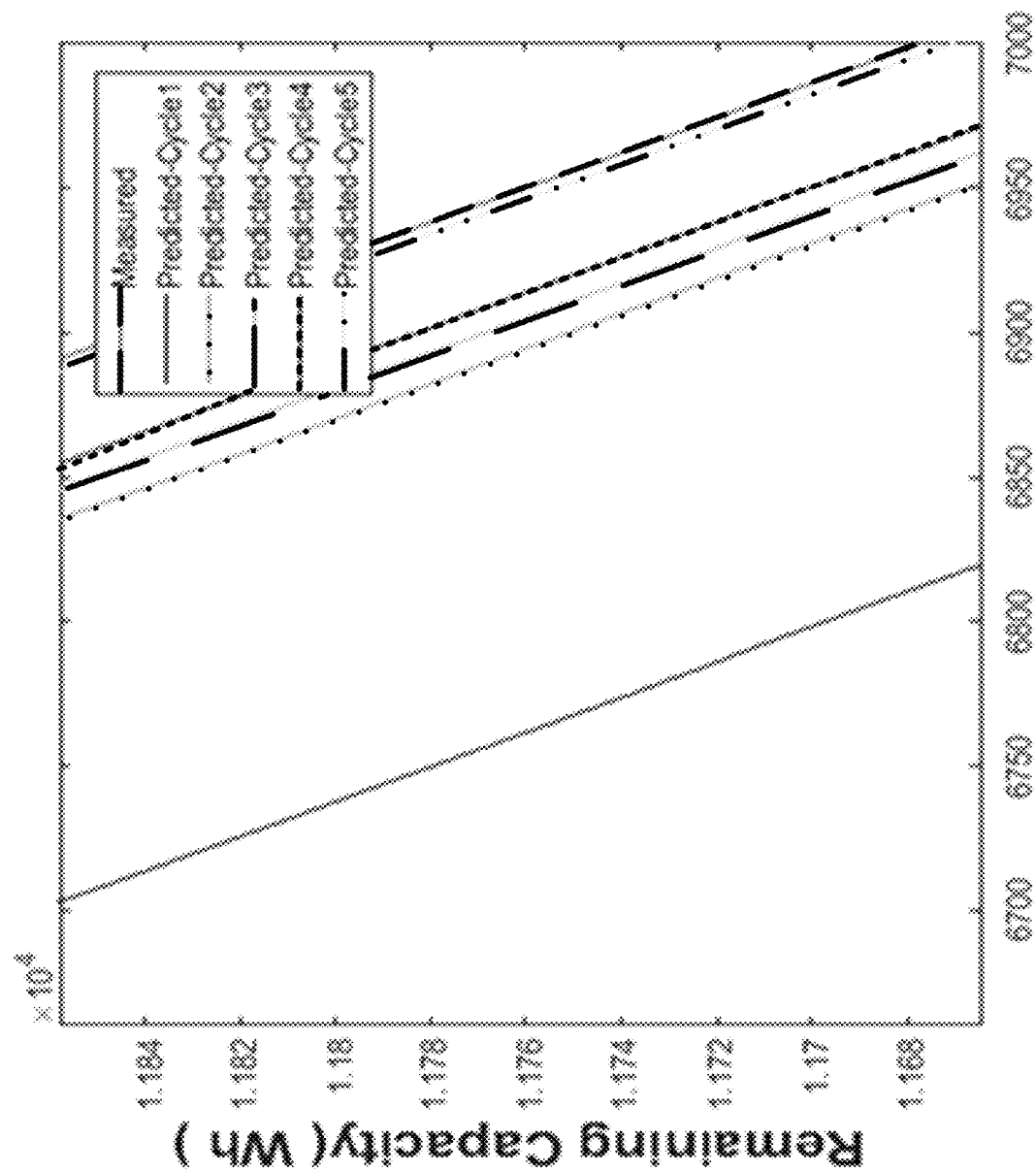
FIG. 6C is a detailed view of a portion of the graph of FIG. 6B.

In some implementations, the controller 200 combines the inputs (e.g., current signal 126a, voltage signal 126b, or temperature signal 126c) from each of the sensors (e.g., the current sensor 123a, the voltage sensor 123b, or the temperature sensor 123c, respectively) and applies the combined inputs as input features to train the neural network 300. FIGS. 6B and 6C show a graph of exemplary predicted remaining capacity using the BPN. The predicted remaining capacity may correspond to training and testing the neural network 300 using the combined inputs, as previously described. In some implementations, the predicted remaining capacity may correspond to the predicted remaining capacity during a discharge mode of the energy storage system 120 determined based on a charge made of the energy storage system 120. Based on the predicted remaining capacity measurement, the controller 200 may track the remaining available capacity in the energy storage system 120 (e.g., the battery system 124) to determine a charge state or life cycle of the energy storage system 120 (e.g., the battery system 124).

Empirical Recursive Methods

In some examples, the controller 200 predicts future measurements by using some of the initial cycle's sensor data 126. The controller estimates the parameters of the series based on the known AR model of order n.

The equation that defines this operation is as follow:

$$Y_k = \alpha^{k-1} Y_1 + \left(\beta \sum_{n=2}^{k-1} \alpha^{k-n}\right) + \beta \tag{9}$$

where $$\alpha = \frac{\sum_{i=1}^{N}(x_i - \bar{x})(y_i - \bar{y})}{\left(\sqrt{\sum_{i=1}^{N}(x_i - \bar{x})^2}\right)\left(\sqrt{\sum_{i=1}^{N}(y_i - \bar{y})^2}\right)}; \tag{10a}$$

$$\beta = \mu(1 - \alpha^2); \tag{10b}$$

and $$\mu = \frac{1}{N}\sum_{i=1}^{N} x_i; \tag{10c}$$

and where $Y_k$ is the $k^{th}$ time series, $Y_1$ is the initial cycle time series, $\alpha$ and $\beta$ are respectively the slope and the intercept. $Y_1$ may represent the initial cycles up to ten cycles and may be updated in an online process to adjust its value.

In this method, initial cycles are considered to calculate the parameters of the algorithm. Taking into consideration Equation (9) and Equation (10), the controller 200 may predict the data into the future. The empirical auto-regressive model is evolving in computing the parameters exposed in Equation (9) and Equation (10). The initial measurement $Y_1$ (voltage or temperature) is considered to be the average of the previous measurements. The slope and intercept are considered as well to be the average values of the previous slope and intercept. This method evolves over cycles and the parameters are updated to determine the new values.

Yule-Walker Approach

The Yule-Walker equations provide several routes to estimating the parameters of an AR(p) model, by replacing the theoretical covariances with estimated values. The Yule-Walker equations include computing the autocorrelation coefficients of the previous step measurements, and then applying those coefficients to predict the next measurements. The Yule-Walker set of equations in solving the AR(p) model are;

$$\begin{bmatrix} \gamma_1 \\ \gamma_2 \\ \gamma_2 \\ \vdots \\ \gamma_P \end{bmatrix} = \begin{bmatrix} \gamma_0 & \gamma_{-1} & \gamma_{-2} & \cdots & \cdots & \cdots \\ \gamma_1 & \gamma_0 & \gamma_{-1} & \cdots & \cdots & \cdots \\ \gamma_2 & \gamma_1 & \gamma_0 & \cdots & \cdots & \cdots \\ \vdots & \vdots & \vdots & \vdots & \vdots & \vdots \\ \vdots & \vdots & \vdots & \vdots & \vdots & \vdots \\ \gamma_{p-1} & \gamma_{p-2} & \gamma_{p-3} & \cdots & \cdots & \cdots \end{bmatrix} \begin{bmatrix} \varphi_1 \\ \varphi_2 \\ \varphi_2 \\ \vdots \\ \varphi_p \end{bmatrix} \tag{11a}$$

This method is auto-regressive and described as:

$$X_t = \Sigma_{i=1}^{P} \varphi_i X_{t-1} + \epsilon_i; \tag{11b}$$

where the coefficients $\varphi_i$ are calculated based on the following equation:

$$\gamma_0 = \Sigma_{k=1}^{P} \varphi_k \gamma_{-k} + \sigma_\epsilon^2 \tag{11c}$$

Knowing the autocorrelation $\gamma_k$ coefficients of the previous steps, the controller 200 may determine the $\varphi_k$ and therefore predict $X_t$. In this case, the standard deviation $\sigma_\epsilon$ is equal to zero.

Figure 7:
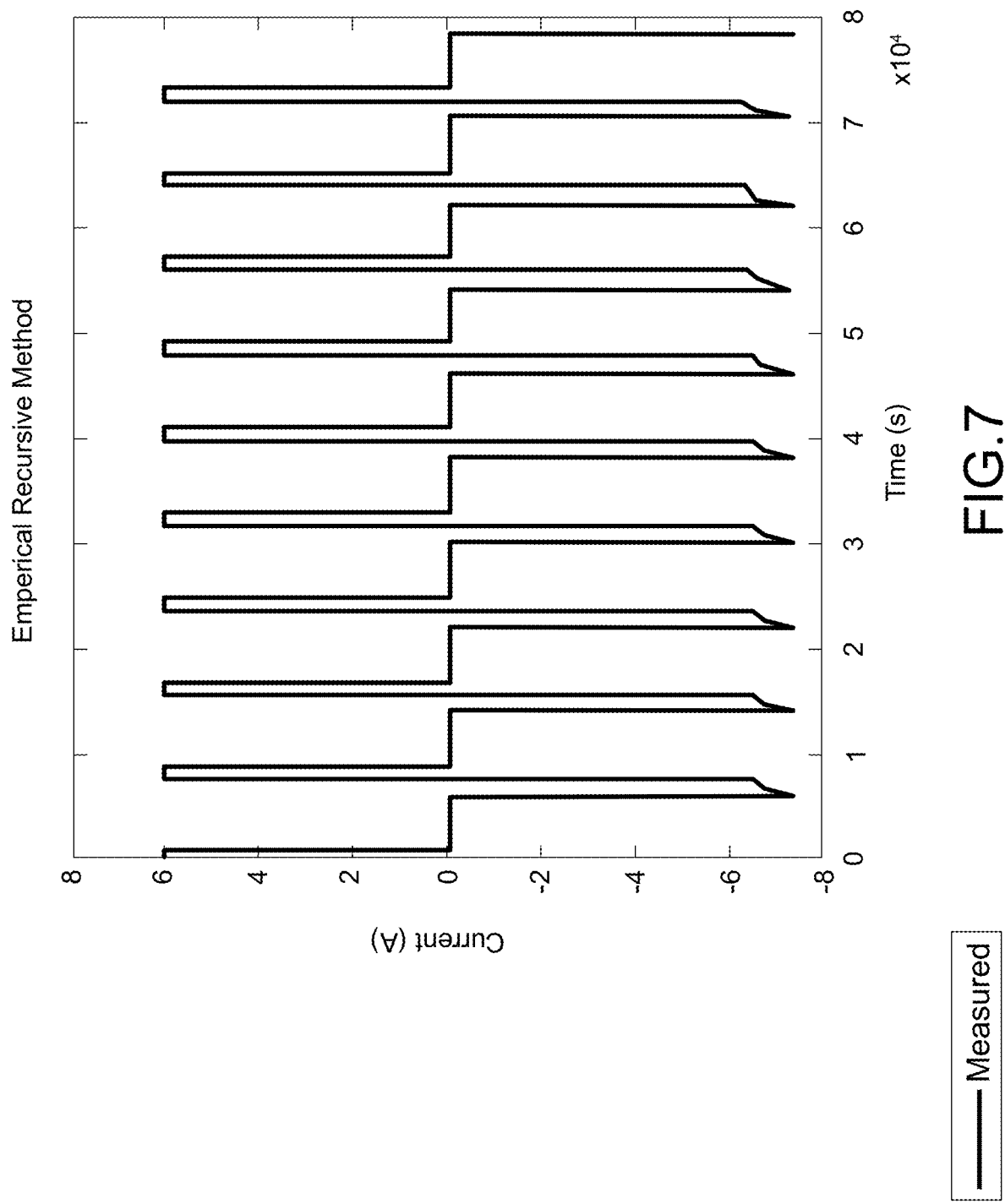
FIG. 7 is a graph of an exemplary input current obtained from battery system sensors.
Figure 8:
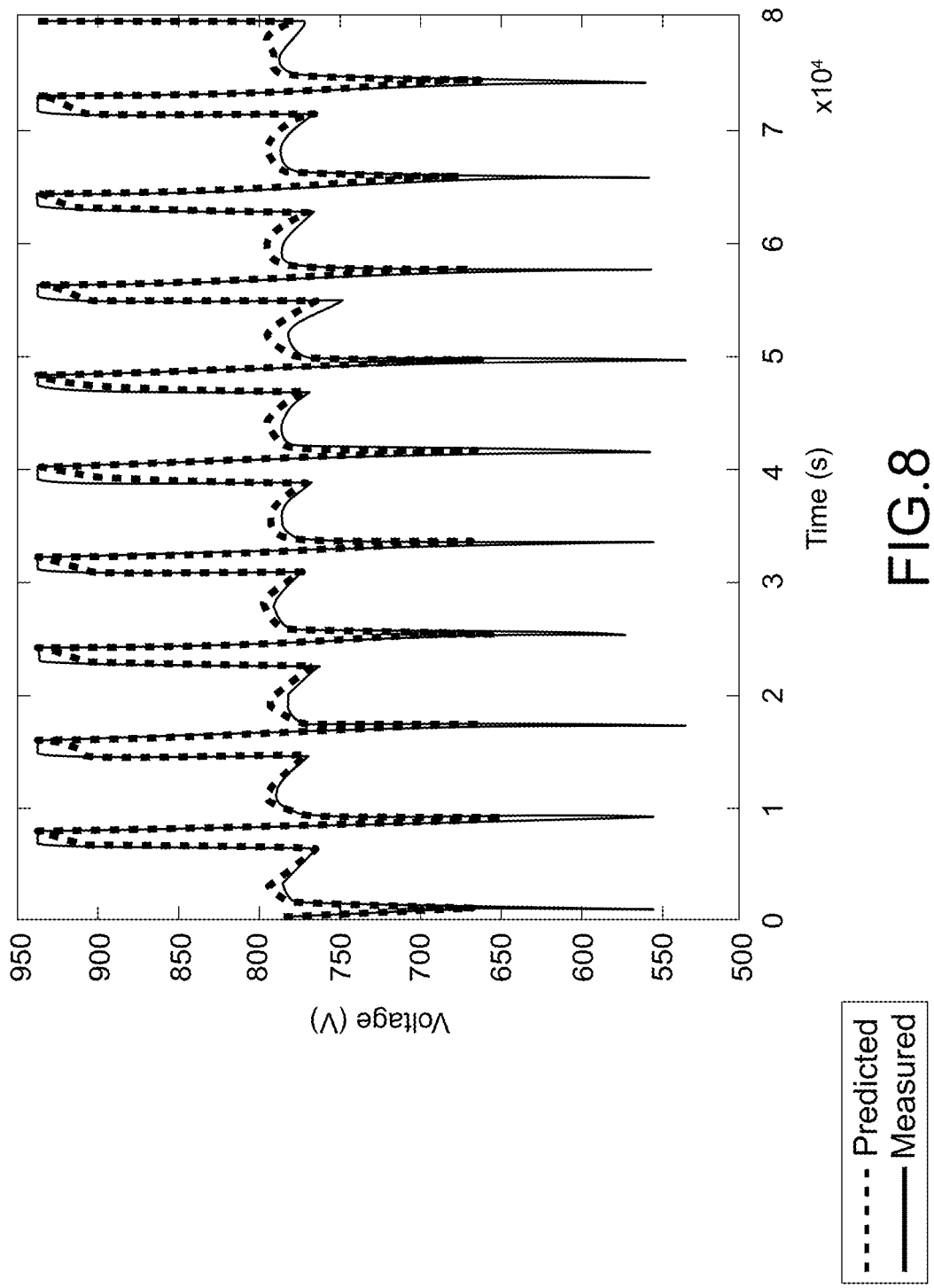
FIG. 8 is a graph of an exemplary voltage predicted using a Yule-Walker approach.
Figure 9:
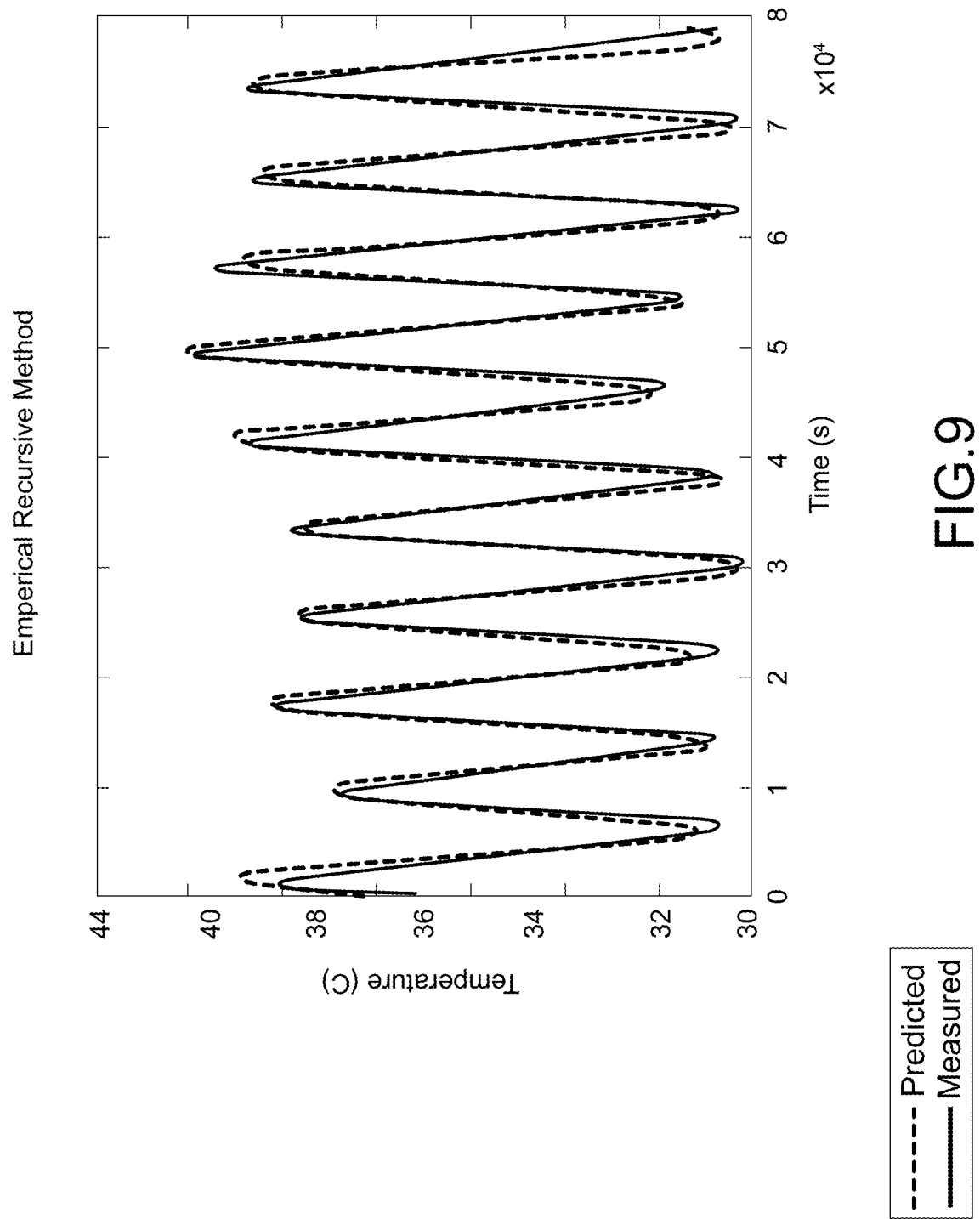
FIG. 9 is a graph of an exemplary temperature predicted using a Yule-Walker approach.

FIG. 7 shows a graph of exemplary input current sensor data 126a obtained by the battery system sensors 123a. FIG. 8 shows a graph of exemplary predicted voltage data 272a using the Yule-Walker approach; while FIG. 9 shows a graph of exemplary predicted temperature data 272b using the Yule-Walker approach.

Quantification of the BMS Performance Metrics

As explained, the controller 200 may use one of three mathematical techniques to determine the predicted data/parameters 272, i.e., predicted voltage data 272a and predicted temperature data 272b. Each one of the described mathematical techniques may output different predicted parameters 272 than the other mathematical techniques. As such, the following discussion demonstrates the different performance metrics of the described mathematical techniques that the controller 200 may implement.

The first law of thermodynamics states that energy may be converted from one form to another with the interaction of heat, work, and internal energy, but it cannot be created nor destroyed. Mathematically, this is represented as:

$$E = W + Q \tag{12}$$

where E is the total change in internal energy of the system, i.e., the battery system 124, Q is the heat exchanged between the battery system 124 and its surroundings, and W is the work done by the battery system 124.

Heat capacity C, also known as thermal capacity, is a measurable physical quantity that is equal to the ratio of the heat added to (or removed from) an object to the resulting temperature change. The controller 200 may determine the heat capacity for the battery system 124 from the following equation:

$$\Delta E = \Delta W + \Delta Q \tag{13}$$

Over a complete charge or discharge cycle $\Delta E = 0$, such that:

$$\Delta W = \int_0^{tcharge} V(t)I(t)dt - \int_{tcharge}^{tdischarge} V(t)I(t)dt \tag{14}$$

Figure 10:
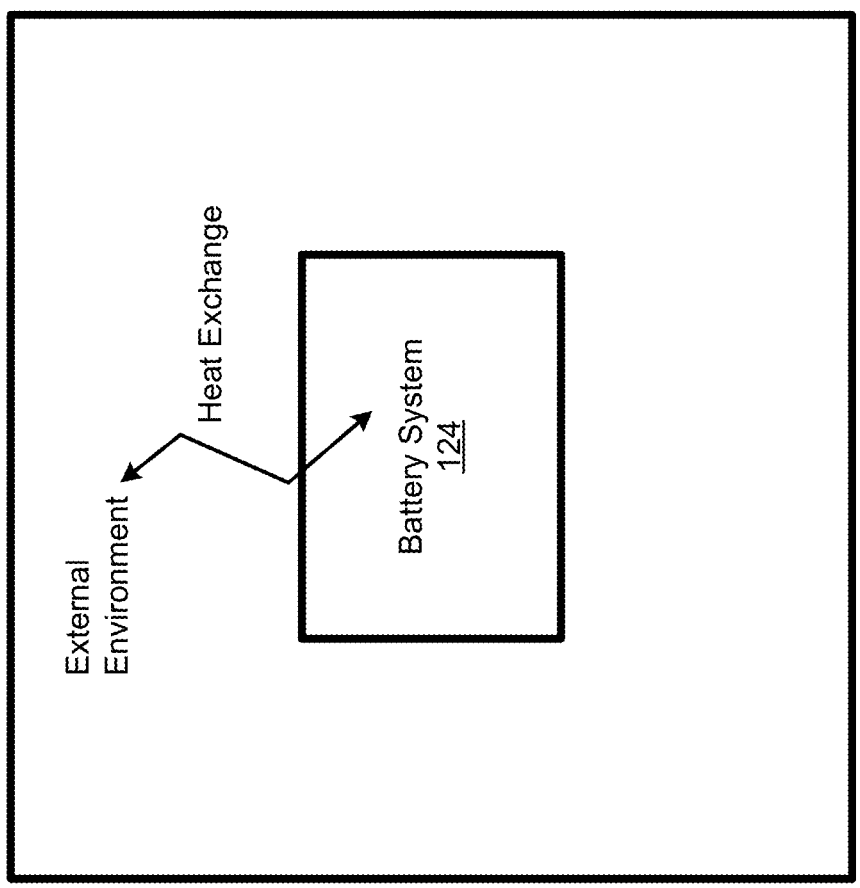
FIG. 10 is a functional block diagram of an exemplary heat exchange between a battery system and its immediate external environment.
Figure 11:
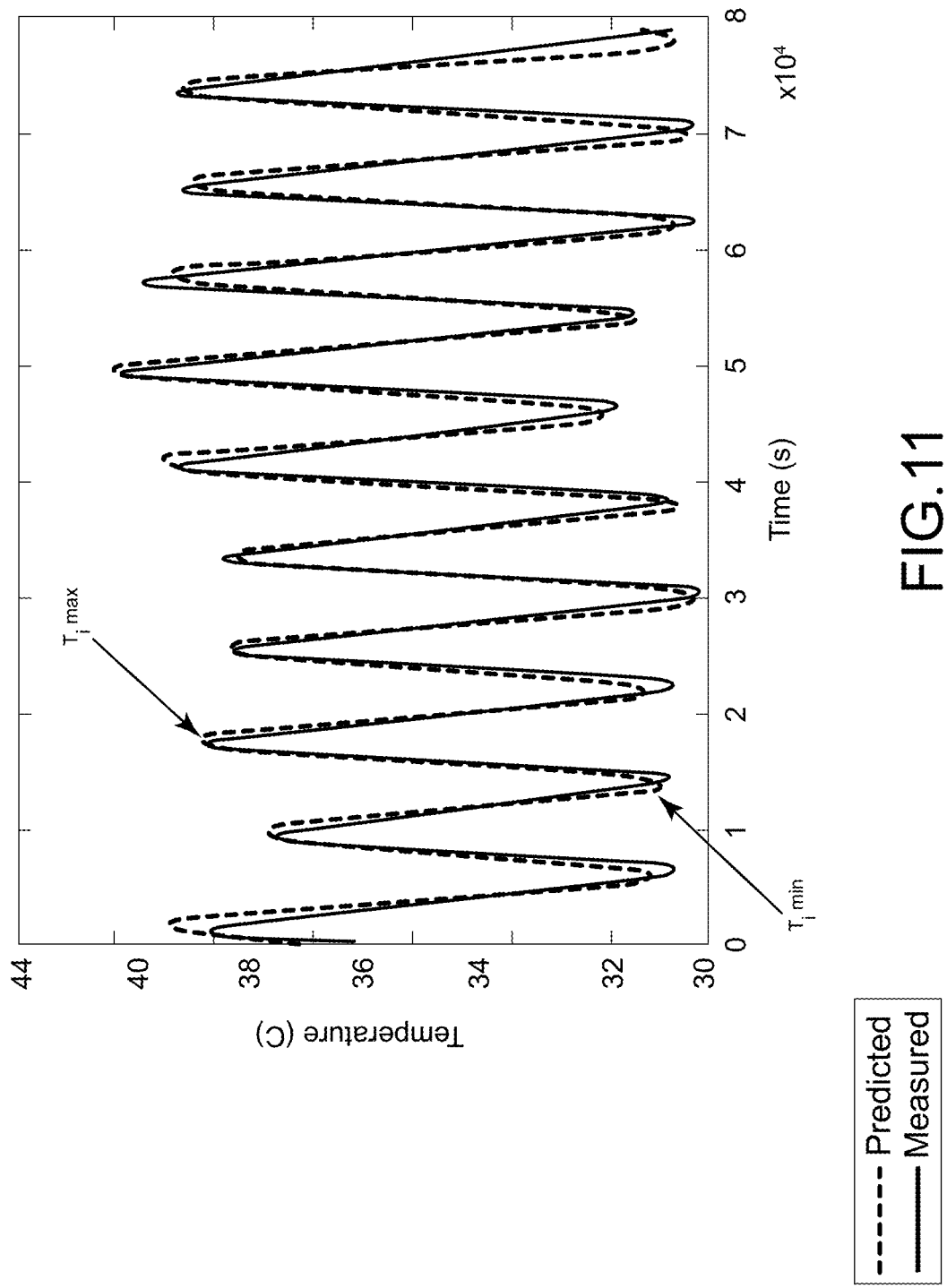
FIG. 11 is a graph of an exemplary calculation of the maximum and minimum temperature associated with a charging cycle.
Figure 12:
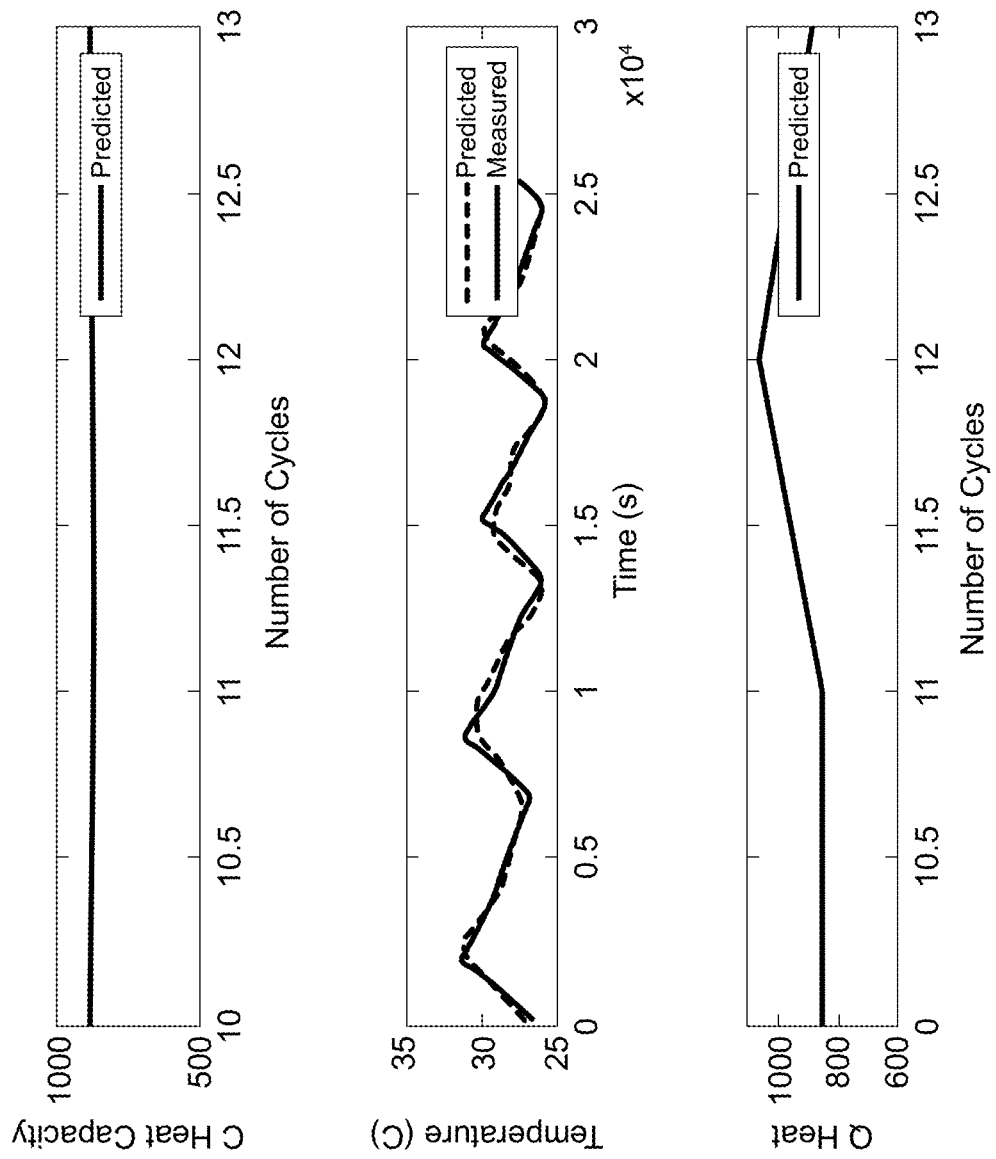
FIG. 12 is a graph of an exemplary prediction of the heat capacity and heat associated with a charging cycle.

The heat capacity C of the battery system 124 at the cycle is given by the following equation;

$$C = \frac{\Delta Q_i}{\Delta T_i} = \frac{\Delta W_i}{\Delta T_i} \tag{15}$$

Where $\Delta T = T_i^{max} - T_i^{min}$ is a temperature difference between the maximum and minimum temperatures when the temperature is increasing for the cycle i. FIG. 10 shows an overview of the heat exchange between the battery system 124 and its immediate environment. As shown, the battery system 124 (for example, a battery string or bank that includes a number of cells/batteries that are connected in series to produce a battery or battery string with the usable voltage/potential) and its surrounding environment exchange heat. The heat of the battery system 124 at cycle i is defined as;

$$Q = K \cdot (T_i^{mean} \cdot T_{ambient})^n |_{n=1,2} \quad (16a)$$

Where $$T_i^{mean} = \frac{(T_i^{min} + T_i^{max})}{2} \quad (16b)$$

where K is a factor, $T_{mean}$ is the mean temperature at temperature rise, and $T_{ambient}$ is the ambient temperature of the external environment of the battery system 124. FIG. 11 illustrates a graph of an exemplary calculation of the maximum and minimum temperature associated with each cycle i; while FIG. 12 illustrates a graph of an exemplary prediction of the heat capacity and heat using thermodynamics equations and derivations of Equations (12-16b). Thermal Efficiency may be defined as the ratio of the heat utilized to the total heat produced electrically. The energy efficiency, also called thermal efficiency, is a measure and defined as:

$$EE = 1 - \frac{Q_{out}}{Q_{in}} = \left(1 - \frac{C * \Delta T}{Q}\right) * 100\% = \left(1 - \frac{C * \Delta T}{K \cdot (T_i^{mean} - T_{ambient})^n}\right) * 100\% \quad (17)$$

where C, $\Delta T$, $T_i^{mean}$, $T_{ambient}$ are the heat capacity, the difference between minimum and maximum temperatures at temperature rise, the mean temperature at temperature rise, and the ambient temperature, respectively.

Validation

In some implementations, the controller 200 may validate the predicted data 272a, 272b with data 126 collected from the sensors 123 using the Mean Square Error (MSE) equation:

$$MSE = \frac{1}{n}\sum_{i=1}^{n}(\overline{Y}_i - Y_i)^2 \quad (18)$$

where $\overline{Y}_i$ and $Y_i$ are the predicted and measured data, respectively.

Use Cases

The below two use cases show the accuracy of the algorithms that the controller 200 uses to predict the predicted values 272 to maintain smooth functioning of the energy storage system 120 as well as to improve its efficiency. However, the algorithms discussed may be used in any use case associated with the energy market.

Use Case 1: Frequency Regulation

Frequency regulation is the injection and withdrawal of power on a second-by-second basis to maintain a threshold frequency. More specifically, an electric power grid transmits power from a power plant 110 to the end user using alternating current (AC), which oscillates at a specific frequency (e.g., 60 Hz for the Americas, and 50 Hz for Europe and Asia). A gap between power generation and usages causes the grid frequency to change. If demand is higher than supply, the frequency will fall, leading to brownouts and blackouts. If the power plants 110 generate more power than consumers 130 are using, the frequency goes up, potentially damaging the grid or the electric devices plugged into it.

Figure 13A:
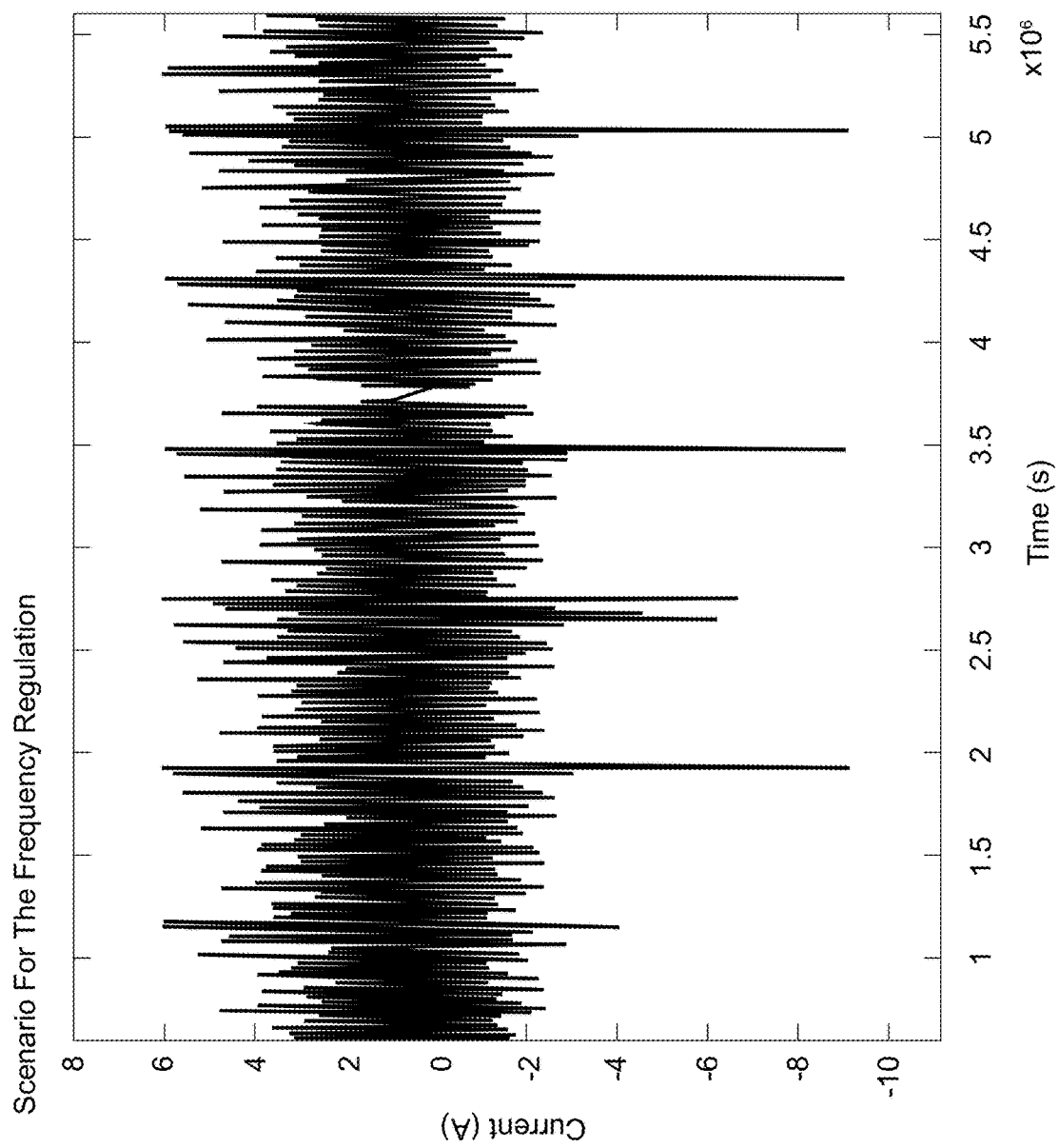
FIG. 13A is a graph of an exemplary current frequency regulation profile associated with a charging cycle.
Figure 13B:
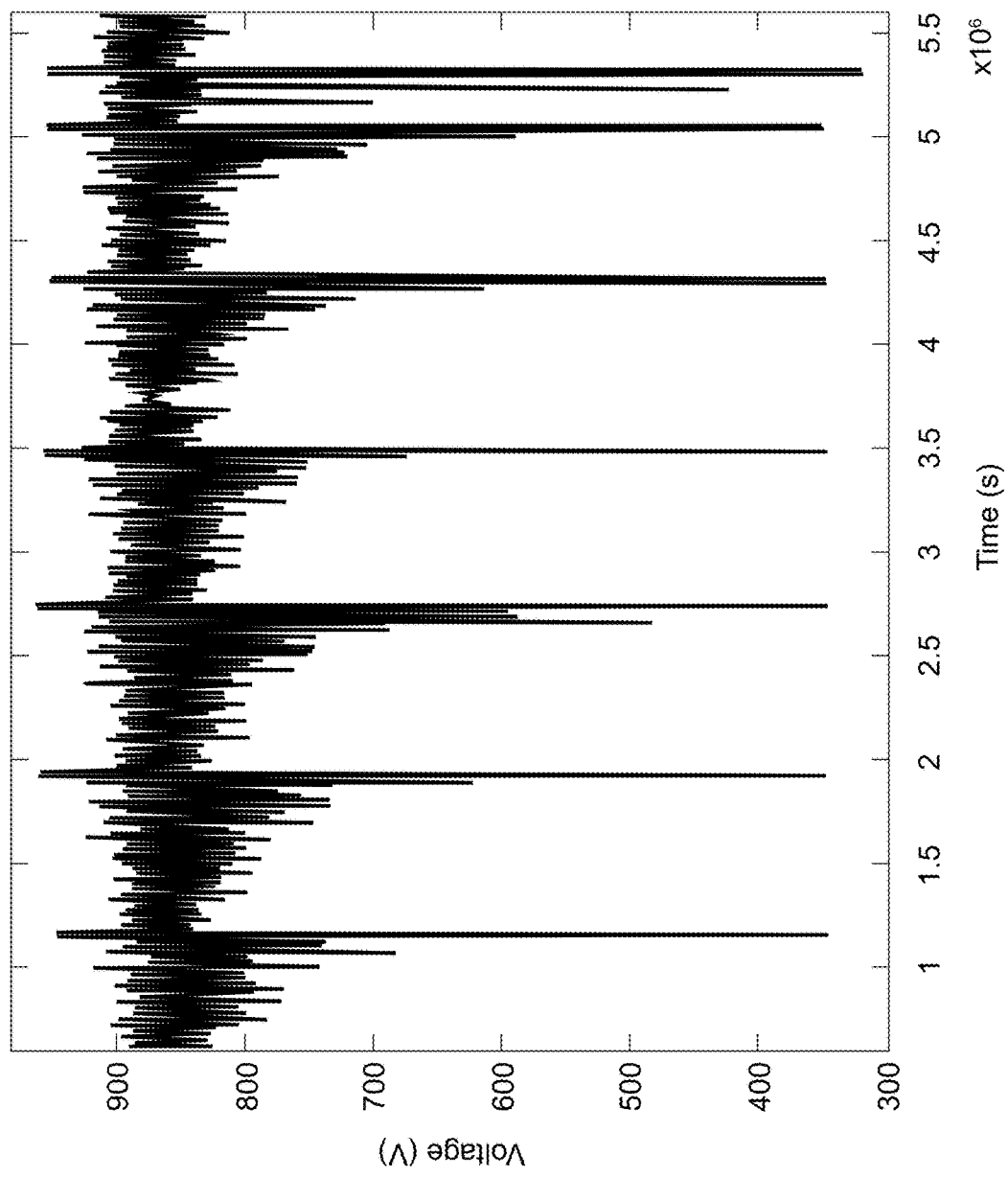
FIG. 13B is a graph of an exemplary voltage frequency regulation profile associated with a charging cycle.

Due to the recent increase in high variable renewable resources and increased variability of demand on the customer side, frequency fluctuations in the power distribution networks 100 have also increased. As such, the network 100 has to continually balance energy supply and demand in order to maintain a consistent power frequency. Therefore, the controller 200 may predict ways to help regulate the frequency of the distributed power by the constant second-by-second adjustment of power to maintain the network frequency and thus to ensure network 100 stability, while using the functions discussed above. In some examples, the energy storage system 120 aids the power distribution network 100 with improving the power quality of the network 100 by implementing frequency regulation. FIG. 13A illustrates a graph of an exemplary current frequency regulation profile; while FIG. 13B illustrates a graph of an exemplary voltage frequency regulation profile.

High frequency oscillations of power distribution from the power plant are necessary to compensate for deviations in network voltage frequency due to high oscillations in total network load. In some examples, it is beneficial to apply a high frequency power signal to adjust an output/input of the battery system 124 to compensate for unanticipated increases or decreases in a total network power load, allowing near instantaneous corrections to power quality issues.

When applying high frequency power, in some examples, the network 10 experiences a drop in voltage. This drop in voltage often occurs during discharge. For example, when the energy storage system 120 reaches a minimum voltage (0% State of Charge), a power plant 110 is applied to the battery system 124 to quickly reach full-charge (100% State of Charge (SOC)) and allow the battery system 124 to function normally. Predicting this 0% SOC state is important to allowing the consumer 130 to anticipate the availability of the battery system 124.

Figure 14:
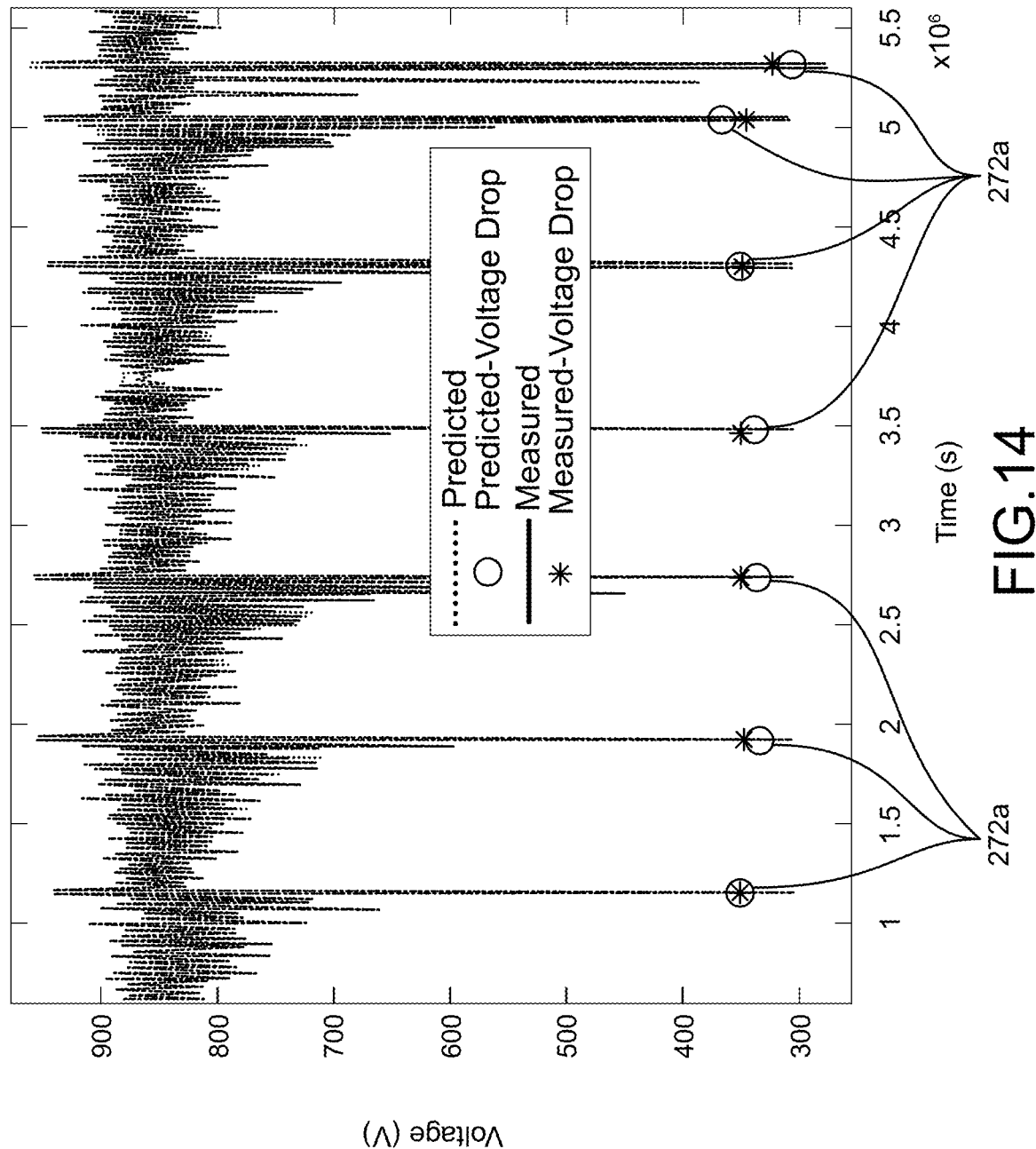
FIG. 14 is a graph of an exemplary comparison between predicted and measured data associated with a charging cycle.

In some examples, the controller 200 uses a predefined fixed value to numerically define the voltage drop. The predefined fixed value may be equal to 350 V. The goal of the suggested algorithm is to predict all the voltages (i.e., voltage prediction data 272a) that manifest a value less than or equal to the fixed threshold (e.g., 350V). The results of the algorithm, as well as the measured data, are displayed in FIG. 14. A visual inspection of FIG. 14 indicates that the predicted results (i.e., voltage prediction data 272a) greatly match the measured data.

To quantify the difference between the predicted data 272 and the measured data, the Root Mean Squared Error (RMSE) may be calculated as defined in Equation (19):

$$RMSE = \left(\frac{1}{n}\sum_{i=1}^{n}(\overline{Y}_i - Y_i)^2\right)^{\frac{1}{2}} \% \quad (19)$$

In this case, the RMSE is suggested to be equal to 1.26%, which leads to an accuracy of approximately 98.7%. The accuracy is defined as:

$$\text{Accuracy} = (100 - RMSE) \% \quad (20)$$

The predictive algorithm described above with reference to FIGS. 1-14 may be beneficial in many aspects of managing and monitoring the battery system 124 when facing this type of use case. For example, the predictive algorithm provides an accurate, fast, optimized method, based on accurate feature selections, to improve the accuracy of the predicted data 272. The predictive algorithm may provide feedback that permits the BMS 122 to adjust the charge and discharge regime of the battery system 124 in real time. In other words, the predictive algorithm provides a time of the voltage drop and the magnitude of the voltage relative to a pre-defined power request.

In some implementations, the controller 200 uses a scoring methodology based on a combination of multiple machine learning algorithms to predict the SOC of the battery system 124. For example, the controller 200 may use one of a fuzzy logic method, a support vector machine, or a deep neural network (e.g., neural network 300) to accurately predict the SOC of the battery system 124. In this regard, the SOC of the battery system 124 at time t may be calculated as defined in Equation (21):

$$SOC(t)=SOC(t_0)+\gamma*\int P(t)_{charge}*\Delta t\, dt + \int P(t)_{discharge}*\Delta t\, dt \quad (21)$$

where SOC(t) is the SOC at time t, $P(t)_{charge}$ is predicted power in a charge mode of the battery system 124, $P(t)_{discharge}$ is predicted power in a discharge mode of the battery system 124, and γ is the predicted efficiency.

In some implementations, the controller 200 uses a scale methodology to scale the SOC between zero percent and one hundred percent to allow an operator to visualize and track the available power capacity of the battery system 124 and change the BMS system 122.

Use Case 2: Day-Ahead Market

In some implementations, the cost to supply electricity varies during the course of a single day. As such, the wholesale price of electricity on the power distribution network 100 reflects the real-time cost for supplying electricity from the power plant 110. For example, electricity demand is usually highest in the afternoon and early evening (peak hours), and costs to provide electricity are usually higher at these times. This use case considers that the battery system 124 is charged during low-price hours at the day-ahead spot market and then discharged during high-price hours. This use case is used to determine the performance of the energy storage system 120 when discharged at different levels of power for market bidding purposes.

Figure 15A:
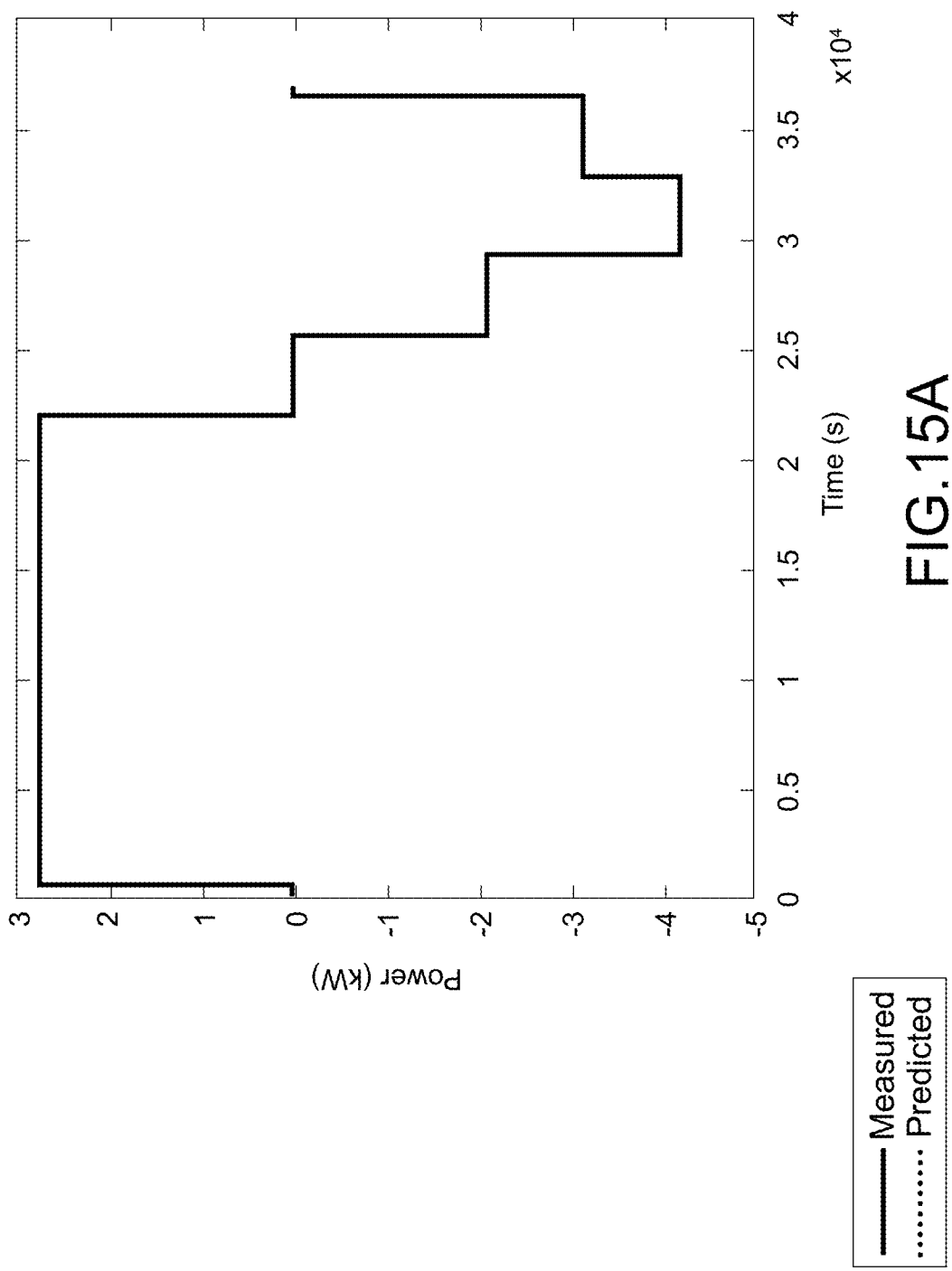
FIG. 15A is a graph of an exemplary power profile.

An example of the power profile "Day Ahead Market" use case is provided in FIG. 15A. As shown, the battery system 124 is charged at constant power (e.g., about time 0-0.25), then discharged with different powers (e.g., about time greater than 2.25) to fulfill the high demand from the energy market. This operation is repeated for every battery of the battery system 124.

Figure 15B:
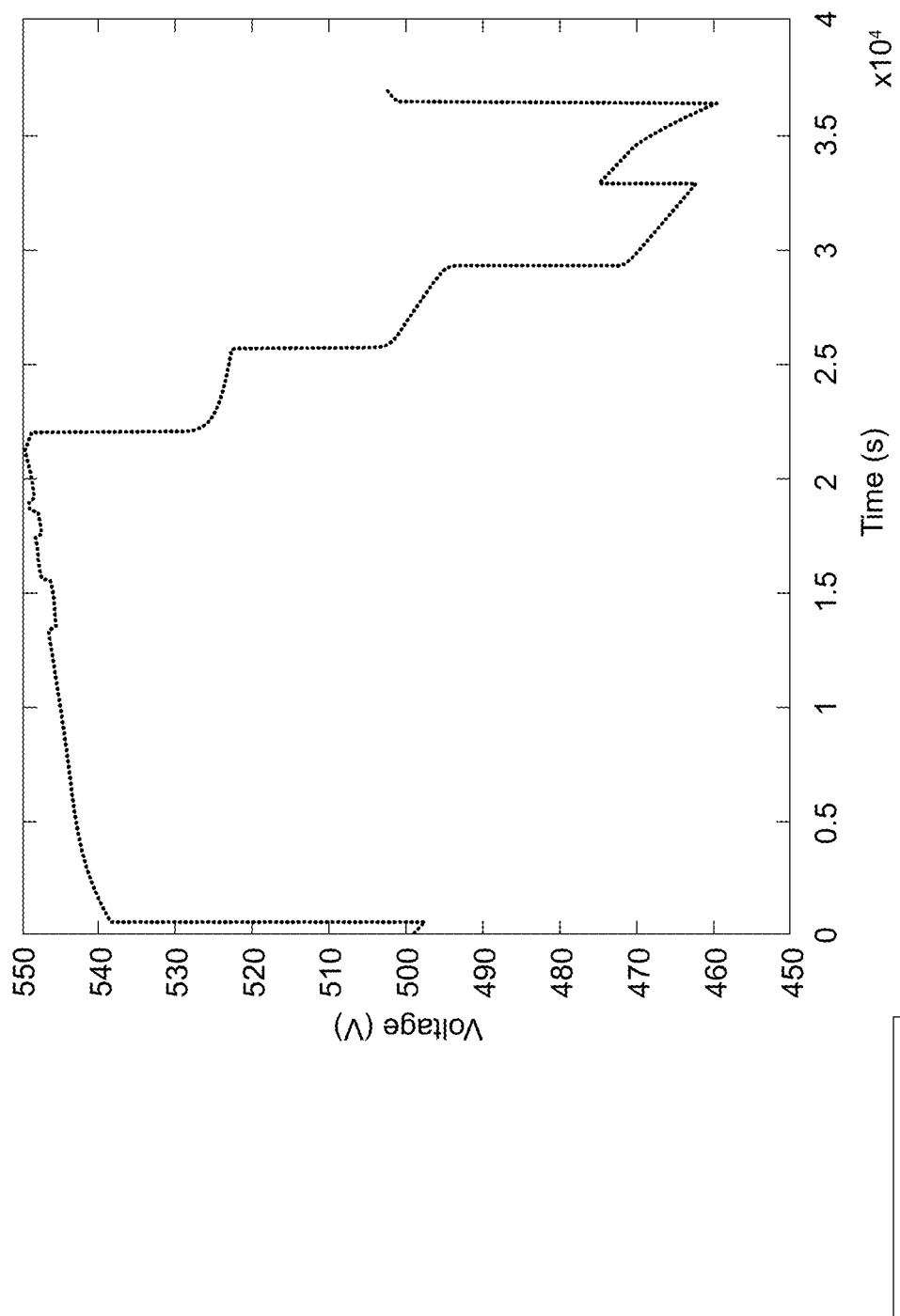
FIG. 15B is a graph of exemplary measured and predicted voltages using power training data of the power profile shown in FIG. 15A.
Figure 16:
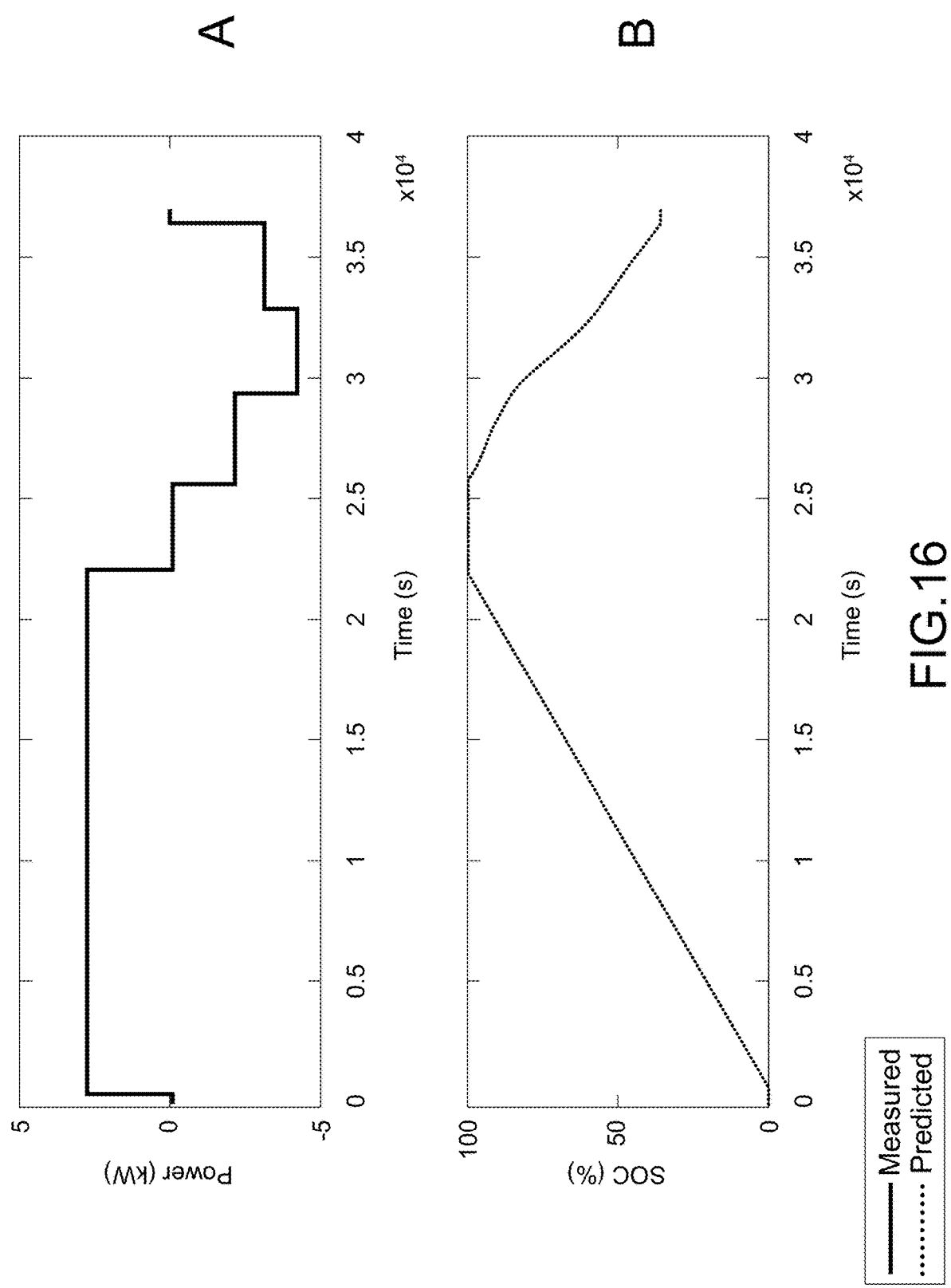
FIG. 16 is a graph of an exemplary power and its associated state-of-charge.

For purpose of analysis, FIG. 15B illustrates a graph of the measured and the predicted voltages. As can be noticed, the predictive data 272 perfectly fits the measured data. The RMSE is suggested to be equal to 0.026% for this example. As such, this leads to an accuracy approaching 100%. Considering FIG. 16, illustrating two graphs A, B, the first graph A being a graph of the power/time of the battery system 124 and the second graph B being the SOC percentage/time of the battery system 124, it is noticeable that the SOC % decreases due to high power discharge (e.g., about time greater than 2.5). This decrease is most apparent at 4 kW, where, the SOC drops to 60%.

Figure 17:
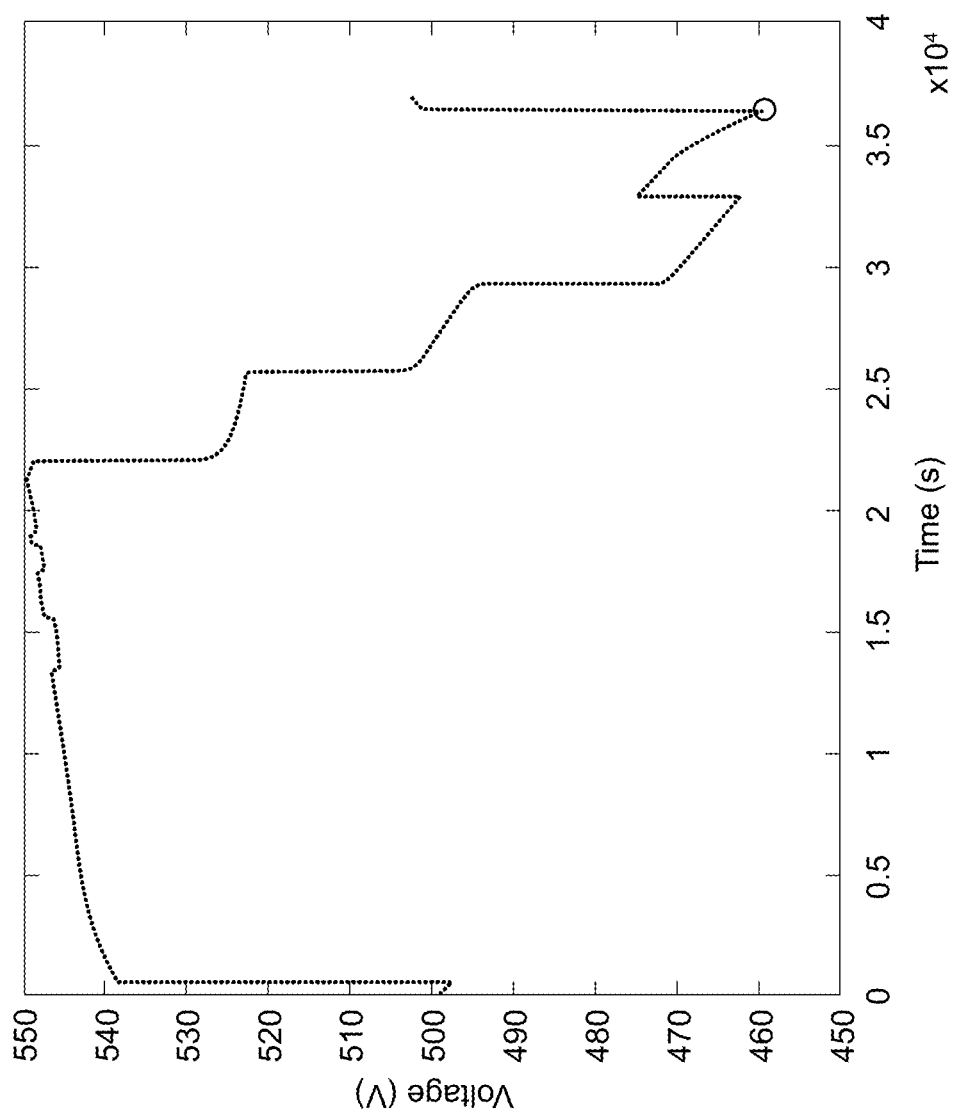
FIG. 17 is a graph of an exemplary voltage profile and a minimum cut-off voltage.

Referring to FIG. 17, the prediction algorithms described above may also predict a minimum cut-off voltage. This corresponds to the lower voltage limit, which may be used to initiate a new charge regime allowing the battery system 124 to function normally, and therefore increase its life cycle.

Therefore, the prediction algorithms discussed above may provide important and beneficial measurements ahead of time. Some of the important and beneficial measurements may include the remaining time duration of the discharge at different powers depending on the market demand. Other important and beneficial measurements may include the voltage, the minimum cut-off voltage, and the SOC needed to monitor the discharge of the battery system 124, while keeping the battery system 124 running smoothly. As such, the distribution network 100 provides the consumer 130 with a complete array of the status information of the battery system 124 and system capabilities.

In some examples, the commercially relevant property of a battery installation is calculated from a minimal set of basis functions or basis variables in the time domain. According to the network 100 described above, energy efficiency is the most important property of the battery installation to be able to predict in the future since it directly drives the profitability of the installation and drive bidding strategies for the energy storage asset. As such, the network 100 is configured to determine the forward projected energy efficiency of an energy storage installation from only the historical time dependent current and time dependent ambient temperature. The methods described are configured to determine a set of time invariant or slowly time varying parameters for each energy storage installation and use these to forward predict the performance given an assumed current and temperature profile. A biding software application may ask the BMS 122 what the efficiency would be for several different possible future load profiles and then choose the most profitable. The best basis functions to do this with appear to be permutations of the set of the current, ambient temperature, the first and second derivative of current and temperature, and the first and second integral of the temperature and current.

Figure 18:
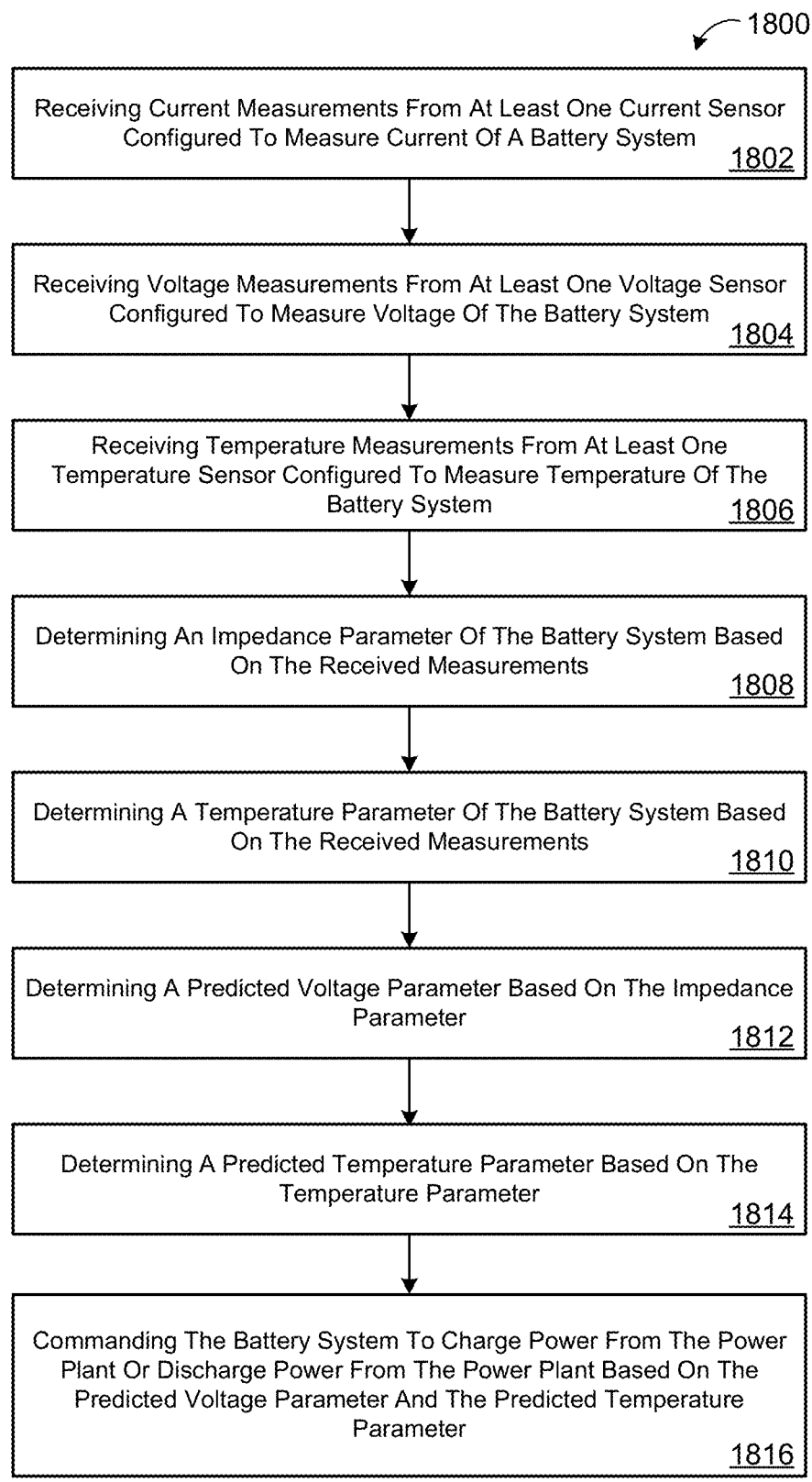
FIG. 18 provides a schematic view of an exemplary arrangement of operations for a method of predicting future battery system parameters.

FIG. 18 provides a schematic view of an exemplary arrangement of operations for a method 1800 of predicting future battery system parameters. At operation 1802, the method 1800 includes receiving, at data processing hardware, current measurements from at least one current sensor configured to measure current of a battery system in communication with a power distribution network having a power plant distributing power to one or more consumers. At operation 1804, the method 1800 includes receiving, at the data processing hardware, voltage measurements from at least one voltage sensor configured to measure voltage of the battery system. At operation 1806, the method 1800 includes receiving, at the data processing hardware, temperature measurements from at least one temperature sensor configured to measure temperature of the battery system. At operation 1808, the method 1800 includes determining, by the data processing hardware, an impedance parameter of the battery system based on the received measurements. At operation 1810, the method 1800 includes determining, by the data processing hardware, a temperature parameter of the battery system based on the received measurements. At operation 1812, the method 1800 includes determining, by the data processing hardware, a predicted voltage parameter based on the impedance parameter. At operation 1814, the method 1800 includes determining, by the data processing hardware, a predicted temperature parameter based on the temperature parameter. At operation 1816, the method 1800 includes commanding, by the data processing hardware, the battery system to charge (e.g., store) power from the power plant or discharge power from the power plant based on the predicted voltage parameter and the predicted temperature parameter. For example, at operation 1816, the method 1800 may include commanding, by the data processing hardware, the battery system to store power from the power plant or discharge power from the power plant based on the predicted voltage parameter and the predicted temperature parameter.

Figure 19:
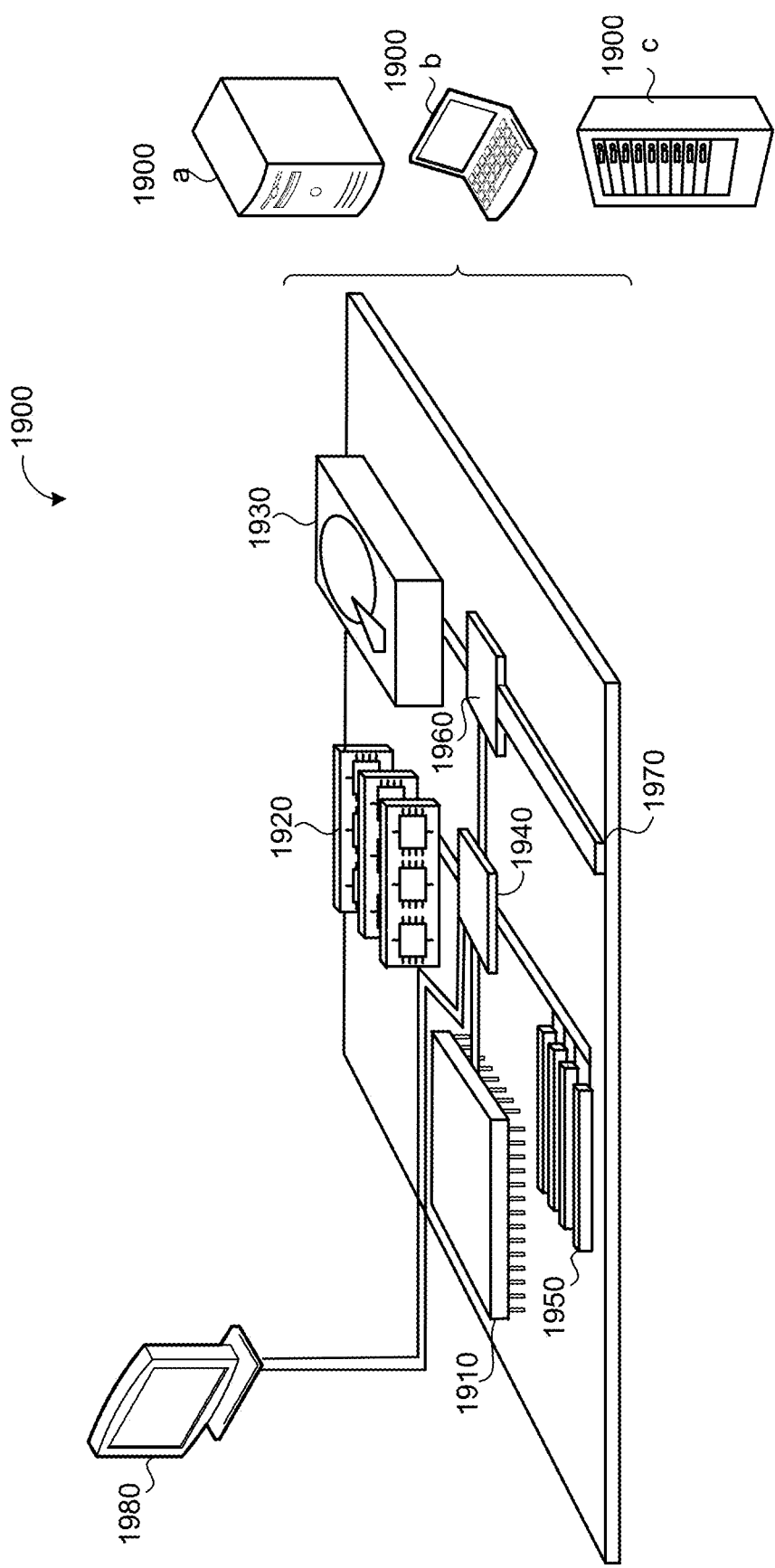
FIG. 19 is a schematic view of an exemplary computing device executing any systems or methods described herein.

FIG. 19 is a schematic view of an example computing device 1900 that may be used to implement the systems and methods described in this document. The computing device 1900 is intended to represent various forms of digital computers, such as laptops, desktops, workstations, personal digital assistants, servers, blade servers, mainframes, and other appropriate computers. The components shown here, their connections and relationships, and their functions, are meant to be exemplary only, and are not meant to limit implementations of the inventions described and/or claimed in this document.

The computing device 1900 includes a processor 1910, memory 1920, a storage device 1930, a high-speed interface/controller 1940 connecting to the memory 1920 and high-speed expansion ports 1950, and a low speed interface/controller 1960 connecting to low speed bus 1970 and storage device 1930. Each of the components 1910, 1920, 1930, 1940, 1950, and 1960, are interconnected using various busses, and may be mounted on a common motherboard or in other manners as appropriate. The processor 1910 can process instructions for execution within the computing device 1900, including instructions stored in the memory 1920 or on the storage device 1930 to display graphical information for a graphical user interface (GUI) on an external input/output device, such as display 1980 coupled to high speed interface 1940. In other implementations, multiple processors and/or multiple buses may be used, as appropriate, along with multiple memories and types of memory. Also, multiple computing devices 1900 may be connected, with each device providing portions of the necessary operations (e.g., as a server bank, a group of blade servers, or a multi-processor system).

The memory 1920 stores information non-transitorily within the computing device 1900. The memory 1920 may be a computer-readable medium, a volatile memory unit(s), or non-volatile memory unit(s). The non-transitory memory 1920 may be physical devices used to store programs (e.g., sequences of instructions) or data (e.g., program state information) on a temporary or permanent basis for use by the computing device 1900. Examples of non-volatile memory include, but are not limited to, flash memory and read-only memory (ROM)/programmable read-only memory (PROM)/erasable programmable read-only memory (EPROM)/electronically erasable programmable read-only memory (EEPROM) (e.g., typically used for firmware, such as boot programs). Examples of volatile memory include, but are not limited to, random access memory (RAM), dynamic random access memory (DRAM), static random access memory (SRAM), phase change memory (PCM) as well as disks or tapes.

The storage device 1930 is capable of providing mass storage for the computing device 1900. In some implementations, the storage device 1930 is a computer-readable medium. In various different implementations, the storage device 1930 may be a floppy disk device, a hard disk device, an optical disk device, or a tape device, a flash memory or other similar solid state memory device, or an array of devices, including devices in a storage area network or other configurations. In additional implementations, a computer program product is tangibly embodied in an information carrier. The computer program product contains instructions that, when executed, perform one or more methods, such as those described above. The information carrier is a computer- or machine-readable medium, such as the memory 1920, the storage device 1930, or memory on processor 1910.

The high speed controller 1940 manages bandwidth-intensive operations for the computing device 1900, while the low speed controller 1960 manages lower bandwidth-intensive operations. Such allocation of duties is exemplary only. In some implementations, the high-speed controller 1940 is coupled to the memory 1920, the display 1980 (e.g., through a graphics processor or accelerator), and to the high-speed expansion ports 1950, which may accept various expansion cards (not shown). In some implementations, the low-speed controller 1960 is coupled to the storage device 1930 and low-speed expansion port 1970. The low-speed expansion port 1970, which may include various communication ports (e.g., USB, Bluetooth, Ethernet, wireless Ethernet), may be coupled to one or more input/output devices, such as a keyboard, a pointing device, a scanner, or a networking device such as a switch or router, e.g., through a network adapter.

The computing device 1900 may be implemented in a number of different forms, as shown in the figure. For example, it may be implemented as a standard server 1900a or multiple times in a group of such servers 1900a, as a laptop computer 1900b, or as part of a rack server system 1900c.

Various implementations of the systems and techniques described herein can be realized in digital electronic and/or optical circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. In some implementations, the computer programs, including the algorithms described herein, are implemented in C++ using optimized and fast OPENMP classes and functions.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" and "computer-readable medium" refer to any computer program product, non-transitory computer readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

The processes and logic flows described in this specification can be performed by one or more programmable processors executing one or more computer programs to perform functions by operating on input data and generating output. The processes and logic flows can also be performed by special purpose logic circuitry, e.g., an FPGA (field programmable gate array) or an ASIC (application specific integrated circuit). Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, one or more aspects of the disclosure can be implemented on a computer having a display device, e.g., a CRT (cathode ray tube), LCD (liquid crystal display) monitor, or touch screen for displaying information to the user and optionally a keyboard and a pointing device, e.g., a mouse or a trackball, by which the user can provide input to the computer. Other kinds of devices can be used to provide interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A number of implementations have been described. Nevertheless, it will be understood that various modifications may be made without departing from the spirit and scope of the disclosure. Accordingly, other implementations are within the scope of the following claims.

What is claimed is:

1. A method comprising:
receiving, at a data processing hardware, current measurements from at least one current sensor configured to measure current of a battery system in communication with a power distribution network having a power plant distributing power to one or more consumers;
receiving, at the data processing hardware, voltage measurements from at least one voltage sensor configured to measure voltage of the battery system;
receiving, at the data processing hardware, temperature measurements from at least one temperature sensor configured to measure temperature of the battery system;
determining, by the data processing hardware, an impedance parameter of the battery system based on the measurements received at the data processing hardware;
determining, by the data processing hardware, a temperature parameter of the battery system based on the measurements received at the data processing hardware;
determining, by the data processing hardware, a predicted voltage parameter based on the impedance parameter;
determining, by the data processing hardware, a predicted temperature parameter based on the temperature parameter; and
commanding, by the data processing hardware, the battery system to charge power from the power plant or discharge power from the power plant based on the predicted voltage parameter and the predicted temperature parameter,
wherein determining the impedance parameter or the temperature parameter comprises determining a transfer function H(w) of a time series f (t) defined in a time interval [−T, T], wherein T is an integer greater than zero, the transfer function H(w), in a complex domain, being defined as:

$$H(w) = \int_{-T}^{+T} f(t) e^{-i\omega t} dt,$$

wherein w=2πF, F is a frequency of a time series of the measurements received at the data processing hardware, defined as t∈R$^n$ and and F∈C$^n$.

2. The method of claim 1, wherein the transfer function H(w) is defined as a ratio between a Fourier transform of an output variable y(t) and an input variable x(t), wherein the output variable y(t) is one of the impedance parameter or the temperature parameter, and the input variable x(t) is one or more of the measurements received at the data processing hardware, and the transfer function H(w) in a discrete domain is determined as:

$$H(w) = \frac{\sum_{p=1}^{N} y(p) e^{-i\omega p}}{\sum_{p=1}^{N} x(p) e^{-i\omega p}}.$$

3. The method of claim 1, wherein determining one of the predicted voltage parameter or the predicted temperature parameter includes executing a time series analysis implementing an auto-regressive model AR(p).

4. The method of claim 3, wherein the auto-regressive model AR(p) is defined as:

$$X_t = x + \sum_{i=1}^{P} \varphi_i X_{t-i} + \epsilon_i;$$

and
wherein $\varphi_1$-$\varphi_p$ are parameters of the auto-regressive model AR(p), c is a constant, and $\epsilon_t$ is white noise.

5. The method of claim 3, further comprising implementing a neural network approach, an empirical recursive method, or a Yule-Walker approach to determine an optimal solution of the auto-regressive model AR(p).

6. The method of claim 1, wherein the commanding the battery system to charge power from the power plant includes commanding the battery system to store power from the power plant.

7. The method of claim 1, further comprising updating an impedance profile, a voltage profile, or a temperature profile based on the voltage measurements or the temperature measurements.

8. The method of claim 1, wherein determining the predicted voltage parameter includes:

training the data processing hardware to generate a best fit of the voltage measurements or the temperature measurements; and predicting, by the data processing hardware, the predicted voltage parameter or the predicted temperature parameter based on the best fit of the voltage measurements or the temperature measurements, respectively.

9. The method of claim 1, further comprising:
tracking, by the data processing hardware, a remaining available capacity of the battery system; and
determining, by the data processing hardware, one of a charge state or life cycle of the battery system.

10. A system comprising:
a data processing hardware; and
a memory hardware in communication with the data processing hardware, the memory hardware storing instructions that when executed on the data processing hardware cause the data processing hardware to perform operations comprising:
  receiving current measurements from at least one current sensor configured to measure current of a battery system in communication with a power distribution network having a power plant distributing power to one or more consumers;
  receiving voltage measurements from at least one voltage sensor configured to measure voltage of the battery system;
  receiving temperature measurements from at least one temperature sensor configured to measure temperature of the battery system;
  determining an impedance parameter of the battery system based on the measurements received at the data processing hardware;
  determining a temperature parameter of the battery system based on the measurements received at the data processing hardware;
  determining a predicted voltage parameter based on the impedance parameter;
  determining a predicted temperature parameter based on the temperature parameter; and
  commanding the battery system to charge power from the power plant or discharge power from the power plant based on the predicted voltage parameter and the predicted temperature parameter;
wherein determining the impedance parameter or the temperature parameter comprises determining a transfer function H(w) of a time series f(t) defined in a time interval [−T, T], wherein T is an integer greater than zero, the transfer function H(w), in a complex domain, being defined as:

$$H(w) = \int_{-T}^{+T} f(t)e^{-i\omega t}dt,$$

and
wherein $w=2\pi F$, F is a frequency of a time series of the measurements received at the data processing hardware, defined as $t \in R^n$ and $F \in C^n$.

11. The system of claim 10, wherein the transfer function H(w) is defined as a ratio between a Fourier transform of an output variable y(t) and an input variable x(t), wherein the output variable y(t) is one of the impedance parameter or the temperature parameter, and the input variable x(t) is one or more of the measurements received at the data processing hardware, and the transfer function H(w) in a discrete domain is determined as:

$$H(w) = \frac{\sum_{p=1}^{N} y(p)e^{-i\omega p}}{\sum_{p=1}^{N} x(p)e^{-i\omega p}}.$$

12. The system of claim 10, wherein determining one of the predicted voltage parameter or the predicted temperature parameter includes executing a time series analysis implementing an auto-regressive model AR(p).

13. The system of claim 12, wherein the auto-regressive model AR(p) is defined as:

$$X_t = c + \Sigma_{i=1}^{P} \varphi_i X_{t-i} + \epsilon_i;$$

and
wherein $\varphi_1$-$\varphi_p$ are parameters of the auto-regressive model AR(p), c is a constant, and $\epsilon_t$ is white noise.

14. The system of claim 12, wherein the instructions, when executed on the data processing hardware, cause the data processing hardware to perform operations comprising:
  implementing a neural network approach, an empirical recursive method, or a Yule-Walker approach to determine an optimal solution of the auto-regressive model AR(p).

15. The system of claim 10, wherein the commanding the battery system to charge power from the power plant includes commanding the battery system to store power from the power plant.

16. The system of claim 10, wherein the instructions, when executed on the data processing hardware, cause the data processing hardware to perform operations comprising:
  updating an impedance profile, a voltage profile, or a temperature profile based on the voltage measurements or the temperature measurements.

17. The system of claim 10, wherein determining the predicted voltage parameter includes:
  training the data processing hardware to generate a best fit of the voltage measurements or the temperature measurements; and
  predicting, by the data processing hardware, the predicted voltage parameter or the predicted temperature parameter based on the best fit of the voltage measurements or the temperature measurements, respectively.

18. The system of claim 10, wherein the instructions, when executed on the data processing hardware, cause the data processing hardware to perform operations comprising:
  tracking a remaining available capacity of the battery system; and
  determining one of a charge state or life cycle of the battery system.

* * * * *